(12) United States Patent
Takebayashi et al.

(10) Patent No.: US 8,420,552 B2
(45) Date of Patent: Apr. 16, 2013

(54) METHOD OF MANUFACTURING A SEMICONDUCTOR DEVICE

(75) Inventors: Yuji Takebayashi, Toyama (JP);
Hirohisa Yamazaki, Toyama (JP);
Sadayoshi Horii, Toyama (JP);
Hideharu Itatani, Toyama (JP); Arito Ogawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 82 days.

(21) Appl. No.: 12/847,328

(22) Filed: Jul. 30, 2010

(65) Prior Publication Data

US 2011/0024875 A1 Feb. 3, 2011

(30) Foreign Application Priority Data

Jul. 31, 2009 (JP) .................................. 2009-179631
Jun. 28, 2010 (JP) .................................. 2010-146099

(51) Int. Cl.
*H01L 21/31* (2006.01)

(52) U.S. Cl.
USPC ....................................................... 438/785

(58) Field of Classification Search .................. 438/381, 438/253, 393, 396, 758, 763, 783, 785
See application file for complete search history.

(56) References Cited

U.S. PATENT DOCUMENTS

| 7,820,506 | B2 * | 10/2010 | Rocklein et al. | 438/240 |
| 2004/0155276 | A1 * | 8/2004 | Iwasaki et al. | 257/301 |
| 2008/0233762 | A1 * | 9/2008 | Hong | 438/763 |
| 2010/0320520 | A1 | 12/2010 | Nakagawa et al. | |

FOREIGN PATENT DOCUMENTS

| JP | 2004-161602 | 6/2004 |
| JP | 2005-259966 | 9/2005 |
| JP | 2006-066587 | 3/2006 |
| JP | 2009-059889 | 3/2009 |
| KR | 1020070003581 | 1/2007 |
| WO | 2008108128 A1 | 11/2007 |

OTHER PUBLICATIONS

Joo et al., "Formation of Hafnium-Aluminum-Oxide Gate Dielectric . . . ", 2003, IEEE Trans. on Electronic Devices, vol. 50, No. 10, pp. 2088-2094, Oct. 2003.*
Sivasubramani et al., "Effect of composition on the thermal stability . . . ", 2007, Journal of Applied Phgysics, vol. 101, 114108, Jun. 2007.*
Park et al., "Enhancement of dielectric constant in HfO2 thin films by adding of Al2O3", 2006, Applied Physics Letters, vol. 89, pp. 192905-1-192905-3, Nov. 2006.*
Phani et al., "Synthesis and characterization of hafnium oxide and hafnium aluminate ultra-thin films . . . ", 2007, Journal of Non-Crystalline Solids, vol. 353, pp. 663-669, Feb. 2007.*

* cited by examiner

*Primary Examiner* — Nikolay Yushin
(74) *Attorney, Agent, or Firm* — Brundidge & Stanger, P.C.

(57) ABSTRACT

A high-k capacitor insulating film stable at a higher temperature is formed. There is provided a method of manufacturing a semiconductor device. The method comprises: forming a first amorphous insulating film comprising a first element on a substrate; adding a second element different from the first element to the first amorphous insulating film so as to form a second amorphous insulating film on the substrate; and annealing the second amorphous insulating film at a predetermined annealing temperature so as to form a third insulating film by changing a phase of the second amorphous insulating film. The concentration of the second element added to the first amorphous insulating film is controlled according to the annealing temperature.

2 Claims, 15 Drawing Sheets

MONOCLINIC PHASE

TETRAGONAL PHASE

METHOD OF MANUFACTURING A SEMICONDUCTOR DEVICE

CROSS-REFERENCE TO RELATED PATENT APPLICATION

This U.S. non-provisional patent application claims priority under 35 U.S.C. §119 of Japanese Patent Applications No. 2009-179631, filed on Jul. 31, 2009, and No. 2010-146099, filed on Jun. 28, 2010, in the Japanese Patent Office, the entire contents of which are hereby incorporated by reference.

BACKGROUND OF THE INVENTION

1. Field of the Invention

The present invention relates to a method of manufacturing a semiconductor device, and more particularly, to an effective technique for forming a metal oxide film on a process-target substrate.

2. Description of the Related Art

Recently, as semiconductor devices are becoming highly integrated, it is necessary to form a much thinner insulating film during the process of forming semiconductor devices. However, due to the presence of tunnel current when the thickness of the insulating film is small, it is desired that the thickness of the insulating film is optimally reduced while maintaining the thickness of the insulating film at a level where the tunnel effect does not occur, and thus high dielectric constant (high-k) metal oxides such as a hafnium oxide film or a zirconium oxide film are drawing attention as capacitor materials. For example, it is difficult to impose electrical restrictions when a film is formed to a thickness of 1.6 nm by using a silicon oxide. However, an equivalent dielectric constant can be obtained by forming a high-k film to a thickness of 4.5 nm by using a hafnium oxide. In this way, mainly for the capacitors of 90-nm to 50-nm dynamic random access memories (DRAMs), high-k films such as hafnium oxide films or zirconium oxide films can be used as insulating films. As a method of forming a high-k film, there is an atomic layer deposition (ALD) method that has good concave part filling characteristics and step coverage.

In the process of forming a hafnium oxide film or zirconium oxide film, an amide compound such as tetra ethyl methyl amino hafnium (TEMAH: $Hf[N(CH_3)(C_2H_5)]_4$) or tetra ethyl methyl amino zirconium (TEMAZ: $Zr[N(CH3)(C_2H_5)]_4$) is widely used as a metal source. $H_2O$ or $O_3$ can be used as an oxidant, and recently $O_3$ is more widely used as an oxidant because better film characteristics can be obtained. In an ALD film forming method, a metal source such as TEMAH or TEMAZ, and an oxidant such as $O_3$ are alternately supplied to a reaction chamber to form a film.

[Patent Document 1] Japanese Unexamined Patent Application Publication No. 2005-259966
[Patent Document 2] Japanese Unexamined Patent Application Publication No. 2006-66587

However, when forming capacitors in 50 or less nanometer DRAM devices, if a hafnium oxide film or silicon oxide film is formed by a film forming method of the related art, it is necessary to increase the size of electrodes due to a low dielectric constant, which makes the process more difficult to implement. As a result, throughput may be decreased or source material consumption may be increased to consequently increase manufacturing costs and cost of ownership (CoO: manufacturing costs per substrate). Relevant examples of the related art are disclosed in Patent Documents 1 and 2.

SUMMARY OF THE INVENTION

Objects of the present invention are to provide a method of manufacturing a semiconductor device by forming a high-k capacitor insulating film which is stable at a high temperature, and a semiconductor device including the capacitor insulating film.

According to an aspect of the present invention, there is provided a method of manufacturing a semiconductor device, including: forming a first amorphous insulating film including one of hafnium and zirconium on a substrate; adding aluminum to the first amorphous insulating film so as to form a second amorphous insulating film on the substrate; and annealing the second amorphous insulating film at a predetermined annealing temperature so as to form a third insulating film including one of a tetragonal hafnium aluminate film and a tetragonal zirconium aluminate film by changing a phase of the second amorphous insulating film, wherein a concentration of the aluminum added to the first amorphous insulating film is controlled according to the annealing temperature such that the third insulating film has an aluminum concentration of 1% to 10% when the annealing temperature is 600° C.

According to another aspect of the present invention, there is provided a method of manufacturing a semiconductor device, including: forming a first amorphous insulating film including one of hafnium and zirconium on a substrate; adding aluminum to the first amorphous insulating film so as to form a second amorphous insulating film on the substrate; and annealing the second amorphous insulating film at a predetermined annealing temperature so as to form a third insulating film including one of a tetragonal hafnium aluminate film and a tetragonal zirconium aluminate film by changing a phase of the second amorphous insulating film, wherein a concentration of the aluminum added to the first amorphous insulating film is controlled according to the annealing temperature such that the third insulating film has an aluminum concentration of 16% or higher when the annealing temperature is 700° C.

According to another aspect of the present invention, there is provided a semiconductor device comprising: a titanium nitride film formed on a substrate as a lower electrode; a cubic hafnium aluminate film (hafnium aluminum film, HfAlO) or a cubic zirconium aluminate film (zirconium aluminum oxide film, ZrAlO) formed directly on the titanium nitride film; and a titanium oxide film formed directly on the cubic hafnium aluminate film or the cubic zirconium aluminate film.

According to another aspect of the present invention, there is provided a substrate processing apparatus comprising: a processing chamber configured to accommodate a substrate; a heating system configured to heat the substrate; a first source gas supply system configured to supply a first source gas comprising a first element into the processing chamber; a second source gas supply system configured to supply a second source gas comprising a second element different from the first element; a reaction gas supply system configured to supply a reaction gas comprising a third element reacting with the first element and the second element into the processing chamber; and a control unit configured to control the heating system, the first source gas supply system, the second source gas supply system, and the reaction gas supply system, wherein the control unit controls the heating system, the first source gas supply system, the second source gas supply system, and the reaction gas supply system so as to alternately supply the first source gas and the reaction gas into the processing chamber for forming a first amorphous insulating film, alternately supply the second source gas and the reaction gas into the processing chamber for forming a second amorphous insulating film, form amorphous stacked films by alternately stacking the first insulating film and the second insulating film, and heat the stacked films to a predetermined temperature according to a concentration of the second insulating film in the stacked films for causing a phase transition of the stacked films to a cubic phase.

DETAILED DESCRIPTION OF THE PREFERRED EMBODIMENTS

First Embodiment of the Present Invention

Hereinafter, a first embodiment will be described as an embodiment of the present invention with respect to the attached drawings.

[Overall Structure of Apparatus]

Figure 1:
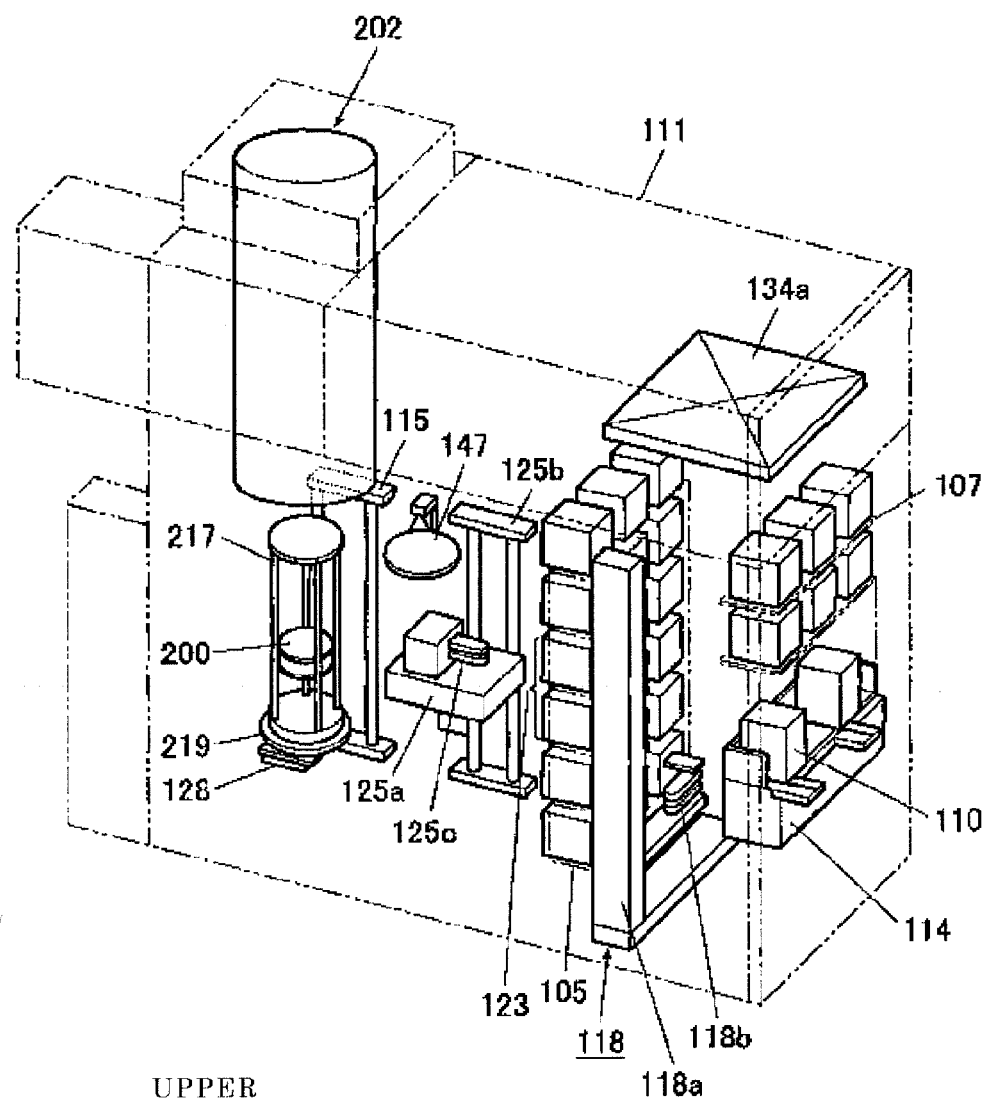
FIG. 1 is a schematic perspective view illustrating a substrate processing apparatus that can be properly used according to an embodiment of the present invention.
Figure 1:
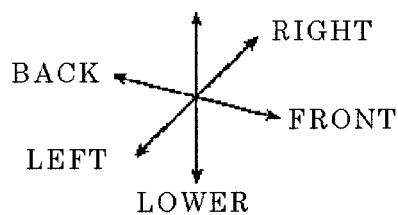

In the current embodiment of the present invention, a substrate processing apparatus is configured as an example of a semiconductor manufacturing apparatus that performs a processing process in a method of manufacturing semiconductor devices (integrated circuits, ICs). In the following description, a vertical processing apparatus will be described as an example of a substrate processing apparatus which is configured to perform a processing process on a substrate such as an oxidation process, a diffusion process, or a chemical vapor deposition (CVD) process. FIG. 1 is a schematic perspective view illustrating a substrate processing apparatus that can be properly used according to an embodiment of the present invention. However, the present invention is not limited to the substrate processing apparatus of the current embodiment. For example, the present invention can be applied to other substrate processing apparatuses such as a substrate processing apparatus having a single-wafer type, hot wall type, or cold wall type processing furnace.

As shown in FIG. 1, in a substrate processing apparatus 101, cassettes 110 are used as wafer carriers to accommodate wafers 200 made of a material such as silicon. The substrate processing apparatus 101 includes a case 111. At the lower side of a front wall of the case 111, an opening is formed as a front maintenance entrance for maintenance works. At the front maintenance entrance, a front maintenance door that can be opened and closed is installed.

At the front maintenance door, a cassette carrying port is installed so that the inside of the case 111 can communicate with the outside of the case 111 through the cassette carrying port, and the cassette carrying port can be opened and closed by using a front shutter.

At a side of the cassette carrying port located inside the case 111, a cassette stage 114 is installed. A cassette 110 is carried on the cassette stage 114 or carried away from the cassette stage 114 by an in-plant carrying device (not shown).

A cassette 110 is placed on the cassette stage 114 by the in-plant carrying device in a state where wafers 200 are vertically positioned inside the cassette 110 and a wafer entrance of the cassette 110 faces upward. The cassette stage 114 is configured so that the cassette 110 is rotated by 90° counterclockwise in a longitudinal direction to the backward of the case 111 so as to horizontally orient the wafers 200 of the cassette 110 and point the wafer entrance of the cassette 110 to the backward of the case 111.

Near the inner center part of the case 111 in a front-to-back direction, a cassette shelf 105 is installed. The cassette shelf 105 is configured to store a plurality of the cassettes 110 in a plurality of stages and a plurality of rows. At the cassette shelf 105, a transfer shelf 123 is installed to store cassettes 110 that are carrying objects of a wafer transfer mechanism 125. In addition, at the upper side of the cassette stage 114, a standby cassette shelf 107 is installed to store standby cassettes 110.

Between the cassette stage 114 and the cassette shelf 105, a cassette carrying device 118 is installed. The cassette carrying device 118 includes a cassette elevator 118a capable of moving upward and downward while holding a cassette 110, and a cassette carrying mechanism 118b. The cassette carrying device 118 is configured to carry cassettes 110 among the cassette stage 114, the cassette shelf 105, and the standby cassette shelf 107 by continuous motions of the cassette elevator 118a and the cassette carrying mechanism 118b.

At the backside of the cassette shelf 105, the wafer transfer mechanism 125 is installed. The wafer transfer mechanism 125 includes a wafer transfer device 125a capable of rotating or linearly moving wafers 200 in a horizontal direction, and a wafer transfer device elevator 125b configured to move the wafer transfer device 125a upward and downward. The wafer transfer device elevator 125b is installed at a right end part of the (pressure-resistant) case 11. The wafer transfer mechanism 125 is configured such that a wafer 200 can be picked up with tweezers 125c of the wafer transfer device 125a by continuous motions of the wafer transfer device 125a and the wafer transfer device elevator 125b so as to charge the wafer 200 into a boat 217 or discharge the wafer 200 from the boat 217.

As shown in FIG. 1, at the rear upper part of the case 111, a processing furnace 202 is installed. The bottom side of the processing furnace 202 is configured to be opened and closed by a furnace port shutter 147.

At the lower side of the processing furnace 202, a boat elevator 115 is installed to move the boat 217 upward to and downward from the processing furnace 202. An arm 128 is connected to the boat elevator 115 as a connecting unit, and a seal cap 219 is horizontally installed on the arm 128 as a cover. The seal cap 219 supports the boat 217 vertically and is configured to close the bottom side of the processing furnace 202.

The boat 217 includes a plurality of holding members and is configured to hold a plurality of wafers 200 (for example, about fifty to one hundred fifty wafers) horizontally in a state where the wafers 200 are vertically arranged with the centers of the wafers 200 being aligned.

As shown in FIG. 1, at the upper side of the cassette shelf 105, a cleaning unit 134a is installed to supply clean air as a purified atmosphere. The cleaning system 134a includes a supply fan and a dust filter to supply clean air to the inside of the case 111.

At the left side end part of the case 111 opposite to the wafer transfer device elevator 125b and the boat elevator 115, another cleaning unit (not shown) is installed to supply clean air. Like the cleaning unit 134a, the cleaning unit includes a supply fan and a dust filter. Clean air supplied through the cleaning unit flows in the vicinities of the wafer transfer device 125a and the boat 217 and is exhausted to the outside of the case 111.

Next, an operation of the substrate processing apparatus 101 will be described.

As shown in FIG. 1, before a cassette 110 is carried onto the cassette stage 114, the front shutter is moved to open the cassette carrying port. Thereafter, the cassette 110 is placed on the cassette stage 114 through the cassette carrying port. At this time, wafers 200 accommodated in the cassette 110 are vertically positioned, and the wafer entrance of the cassette 110 faces upward.

Next, the cassette 110 is rotated counterclockwise by 90° in a longitudinal direction toward the backside of the case 111 by the cassette stage 114 so that the wafers 200 accommodated in the cassette 110 can be horizontally positioned and the wafer entrance of the cassette 110 can face the backside of the case 111.

After that, the cassette 110 is automatically carried and placed by the cassette carrying device 118 to a predetermined position of the cassette shelf 105 or the standby cassette shelf 107 where the carry cassette 110 is temporarily stored, and then the cassette 110 is transferred to the transfer shelf 123 from the cassette shelf 105 or the standby cassette shelf 107 by the cassette carrying device 118. Alternatively, the cassette 110 is directly transferred to the transfer shelf 123.

After the cassette 110 is transferred to the transfer shelf 123, a wafer 200 is picked up from the cassette 110 through the wafer entrance of the cassette 110 by the tweezers 125c of the wafer transfer device 125a and is charged into the boat 217 disposed at the backside of a transfer chamber 124. After the wafer transfer device 125a delivers the wafer 200 to the boat 217, the wafer transfer device 125a returns to the cassette 110 to charge the next wafer 200 into the boat 217.

After a predetermined number of wafers 200 are charged into the boat 217, the bottom side of the processing furnace 202 closed by the furnace port shutter 147 is opened by moving the furnace port shutter 147. Next, the boat 217 in which the wafers 200 are held is loaded into the processing furnace 202 by lifting the seal cap 219 using the boat elevator 115.

After loading the boat 217, a predetermined process is performed on the wafers 200 disposed in the processing furnace 202. Thereafter, the wafers 200 and the cassette 110 are carried to the outside of the case 111 in the reverse sequence of the above.

[Structure of Processing Furnace]

Figure 2:
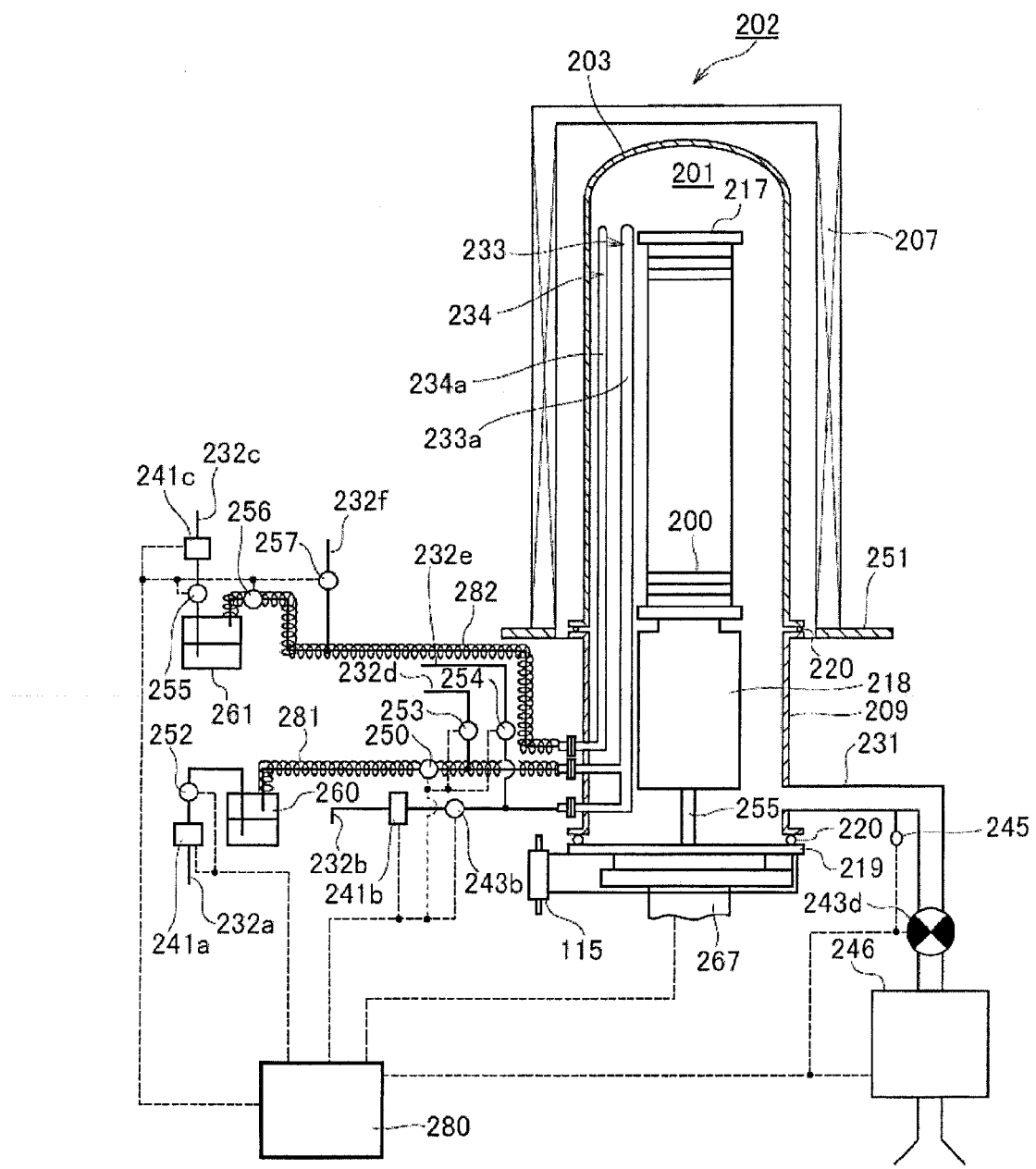
FIG. 2 is a schematic view illustrating an exemplary processing furnace and accompanying members that can be properly used according to the embodiment of the present invention, in which a vertical section of the processing furnace is illustrated.

FIG. 2 is a vertical sectional view schematically illustrating the vertical type processing furnace 202 of the substrate processing apparatus 101 illustrated in FIG. 1. Inside a heater 207 which is a heating system (heating device), a reaction tube 203 is installed as a reaction vessel to process substrates such as wafers 200. A manifold 209 made of a material such as stainless steel is engaged with the bottom side of the reaction tube 203. At the bottom side of the reaction tube 203 and the top side of the manifold 209, ring-shaped flanges are respectively formed. Between the flanges, a sealing member (such as an O-ring 220) is disposed for hermetical sealing between the flanges. In addition, the bottom side of the manifold 209 is hermetically closed by a cover such as the seal cap 219 with a sealing member such as an O-ring 220 being disposed therebetween. In addition, the manifold 209 is fixed by a holding member (such as a heater base 250).

The processing furnace 202 is constituted at least by the heater 207, the reaction tube 203, the manifold 209, and the seal cap 219. In addition, the reaction tube 203, the manifold 209, and the seal cap 219 constitute a processing chamber 201.

At the seal cap 219, the boat 217 that is a substrate holding member is installed with a boat support 218 being disposed between the seal cap 219 and the boat 217. The boat support 218 is a holding body which is used to hold the boat 217. The boat 217 is configured to be loaded into the processing chamber 201 from the bottom side of the processing chamber 201. In the boat 217, a plurality of wafers 200 to be batch processed are horizontally held and piled in multiple stages in the axial direction of the boat 217. The heater 207 is used to heat the wafers 200 placed in the processing chamber 201 to a predetermined temperature.

Three gas supply pipes 232a, 232b, and 232c are installed at the manifold 209 as supply passages to supply a plurality of kinds of gases (three kinds of gases in this example).

The gas supply pipes 232a, 232b, and 232c are installed through a lower part of the sidewall of the manifold 209. The downstream sides of the gas supply pipes 232a and 232b are joined at a lower inner part of the processing chamber 201 and communicate with the upstream side of a vertically extending multi-hole nozzle 233. The two gas supply pipes 232a and 232b and the multi-hole nozzle 233 constitute a confluent gas supply nozzle 233 (described later). In addition, the downstream side of the gas supply pipe 232c is connected to a vertically extending multi-hole nozzle 234 at a lower inner part of the processing chamber 201 and communicates with the upstream side of the vertically extending multi-hole nozzle 234. The gas supply pipe 232c and the multi-hole nozzle 234 constitute a separative gas supply nozzle 234 (described later). In this way, the confluent gas supply nozzle 233 and the separative gas supply nozzle 234 are installed in the processing chamber 201.

A second source gas which contains aluminum (Al) as a second element is supplied through the gas supply pipe 232a. For example, trimethylaluminum (TMA: $(CH_3)_3Al$) gas is supplied through the gas supply pipe 232a as the second source gas. At the gas supply pipe 232a, a carrier gas supply source (not shown) configured to supply a carrier gas (inert gas) such as He, Ne, Ar, or $N_2$ gas; a flow rate control device (flow rate control unit) such as a mass flow controller 241a; an on-off valve such as a valve 252; a TMA container 260 configured to store liquid TMA at normal temperature; and an on-off valve such as valve 250 are sequentially installed from the upstream side of the gas supply pipe 232a. A part of the gas supply pipe 232a located at the upstream side of the TMA container 260 is configured as a carrier gas supply pipe to supply a carrier gas from the carrier gas supply source (not shown) to the inside of the TMA container 260. In addition, a part of the gas supply pipe 232a located at the downstream side of the TMA container 260 is configured to supply TMA gas generated from the TMA container 260 to the inside of the processing chamber 201 through the confluent gas supply nozzle 233. In addition, a heater 281 is installed on the gas supply pipe 232a in a region from the TMA container 260 to the manifold 209. The heater 281 is configured to keep the inside of the gas supply pipe 232a at a predetermined temperature, for example, in the range form 50° C. to 60° C. The upper part of the confluent gas supply nozzle 233 extends to a region the temperature of which is equal to or higher than the decomposition temperature of TMA. However, the temperature of an inner position of the processing chamber 201 where the gas supply pipe 232a joins the gas supply pipe 232b is lower than the decomposition temperature of TMA, the temperature of wafers 200, and the temperature of a region neighboring the wafers 200. A second source gas supply system configured to supply a second source gas containing a second element to the inside of the processing chamber 201 is constituted mainly by the gas supply pipe 232a, the carrier gas supply source (not shown), the mass flow controller 241a, the valve 252, the TMA container 260, the valve 250, the multi-hole nozzle 233, and the heater 281.

A reaction gas containing oxygen (O) as a third element is supplied through the gas supply pipe 232b. For example, $O_3$ gas is supplied through the gas supply pipe 232b as the reaction gas. The third element (oxygen (O)) is different from the second element (aluminum) and a first element (hafnium (Hf) or zirconium (Zr)) but can react with the second element and the first element (described later), respectively. At the gas supply pipe 232b, an $O_3$ gas supply source, a flowrate controller (flowrate control unit) such as a mass flow controller 241b, and a valve 243b are sequentially installed from the upstream side of the gas supply pipe 232b. The downstream side of the gas supply pipe 232b is joined to the downstream side of the gas supply pipe 232a and is connected to the upstream side of the confluent gas supply nozzle 233 installed in the processing chamber 201. A reaction gas supply system configured to supply a reaction gas containing a third element to the inside of the processing chamber 201 is constituted mainly by the gas supply pipe 232b, the $O_3$ gas supply source (not shown), the mass flow controller 241b, the valve 243b, and the confluent gas supply nozzle 233.

A first source gas which contains hafnium (Hf) or zirconium (Zr) as a first element is supplied through the gas supply pipe 232c. For example, tetra ethyl methyl amino hafnium (TEMAH: $Hf[N(CH_3)(C_2H_5)]_4$) gas is supplied through the gas supply pipe 232c as the first source gas. At the gas supply pipe 232c, a carrier gas supply source (not shown) configured to supply a carrier gas (inert gas) such as He, Ne, Ar, or $N_2$ gas; a flow rate control device (flow rate control unit) such as a mass flow controller 241c; an on-off valve such as a valve 255; a TEMAH container 261 configured to store liquid TEMAH at normal temperature; and an on-off valve such as valve 256 are sequentially installed from the upstream side of the gas supply pipe 232c. A part of the gas supply pipe 232c located at the upstream side of the TEMAH container 261 is configured as a carrier gas supply pipe so as to supply a carrier gas from the carrier gas supply source (not shown) to the inside of the TEMAH container 261. In addition, a part of the gas supply pipe 232c located at the downstream side of the TEMAH container 261 is configured to supply TEMAH gas generated from the TEMAH container 261 to the inside of the processing chamber 201 through the separative gas supply nozzle 234. A heater 282 is installed on the gas supply pipe 232c in a region from the TEMAH container 261 to the manifold 209. The heater 282 is configured to keep the inside of the gas supply pipe 232c at a predetermined temperature, for example, at 130° C. A first source gas supply system configured to supply a first source gas containing a first element to the inside of the processing chamber 201 is constituted mainly by the gas supply pipe 232c, the carrier gas supply source (not shown), the mass flow controller 241c, the valve 255, the TEMAH container 261, the valve 256, the separative gas supply nozzle 234, and the heater 282.

In addition, a gas supply pipe 232d configured to supply inert gas such as He, Ne, Ar, or $N_2$ gas is connected to the downstream side of the valve 250 of the gas supply pipe 232a through a valve 253. At the gas supply pipe 232b configured to supply $O_3$ gas, a gas supply pipe 232e configured to supply inert gas is connected to the downstream side of the valve 243b of the gas supply pipe 232b through a valve 254. At the gas supply pipe 232c configured to supply TEMAH gas, a gas supply pipe 232f configured to supply inert gas is connected to the downstream side of the valve 256 of the gas supply pipe 232c through a valve 257.

At the reaction tube 203, an exhaust pipe 231 is installed to exhaust the inside atmosphere of the processing chamber 201. A vacuum exhaust device such as a vacuum pump 246 is connected to the exhaust pipe 231 through a pressure detector (pressure detecting unit) such as a pressure sensor 245 configured to detect the inside pressure of the processing chamber 201 and a pressure regulator (pressure regulating unit) such as an auto pressure controller (APC) valve 243d, so that the inside of the processing chamber 201 can be evacuated to a predetermined pressure (vacuum degree). The APC valve 243d is an on-off valve, which can be opened and closed to start and stop vacuum evacuation of the inside of the processing chamber 201 and can be adjusted in degree of valve opening for pressure adjustment. An exhaust system is constituted mainly by the exhaust pipe 231, the APC valve 243d, the vacuum pump 246, and the pressure sensor 245.

The confluent gas supply nozzle 233 and the separative gas supply nozzle 234 are installed in a manner such that they extend from the lower side to the upper side of the inside of the processing chamber 201 in the direction where wafers 200 are stacked. As described above, the confluent gas supply nozzle 233 is a nozzle constituted by the gas supply pipes 232a and 232b joined at a lower inner part of the processing chamber 201 and the multi-hole nozzle 233 communicating with the gas supply pipes 232a and 232b. In addition, the separative gas supply nozzle 234 is an independent nozzle constituted by the gas supply pipe 232c and the multi-hole nozzle 234 that communicate with each other at a lower inner part of the processing chamber 201.

A plurality of gas supply holes 233a are formed in the multi-hole nozzle 233 of the confluent gas supply nozzle 233. In addition, a plurality of gas supply holes 234a are formed in the separative gas supply nozzle 234.

At the bottom side of the seal cap 219, a rotary device (rotary unit) such as a boat rotating mechanism 267 is installed to rotate the boat 217 for improving processing uniformity. A shaft 255 of the boat rotating mechanism 267 penetrates the seal cap 219 and supports the boat 217 from the bottom side of the boat 217. By operating the boat rotating mechanism 267, the boat 217 supported on the boat support 218 and wafers 200 held in the boat 217 can be rotated. In addition, the seal cap 219 is configured to be vertically moved by an elevating mechanism such as the boat elevator 115 installed outside the reaction tube 203. By operating the boat elevator 115, the boat 217 placed on the seal cap 219 can be raised and lowered so as to load the boat 217 into the processing chamber 201 and unload the boat 217 from the processing chamber 201.

A controller 280 which is a control unit (control part) is connected to the mass flow controllers 241a, 241b, and 241c; the valves 252, 250, 243b, 255, 253, 254, and 256; the heaters 207 and 281; the vacuum pump 246; the APC valve 243d; the boat rotating mechanism 267; and the boat elevator 115. The controller 280 controls operations such as the flow rate adjusting operations of the mass flow controllers 241a, 241b, and 241c; the opening and closing operations of the valves 252, 250, 243b, 255, 253, 254, and 256; the temperature adjusting operations of the heaters 207 and 281; the start and stop operations of the vacuum pump 246; the opening, closing, and pressure adjusting operations of the APC valve 243d; the rotation speed adjusting operation of the boat rotating mechanism 267; and the elevating operation of the boat elevator 115.

[Method of Manufacturing Semiconductor Device]

Next, an explanation will be given on an exemplary method of forming insulating films on substrates by using the processing furnace 202 of the substrate processing apparatus 101 in a semiconductor device manufacturing process. In the following description, operations of parts of the substrate processing apparatus 101 are controlled by the controller 280.

Figure 3A:
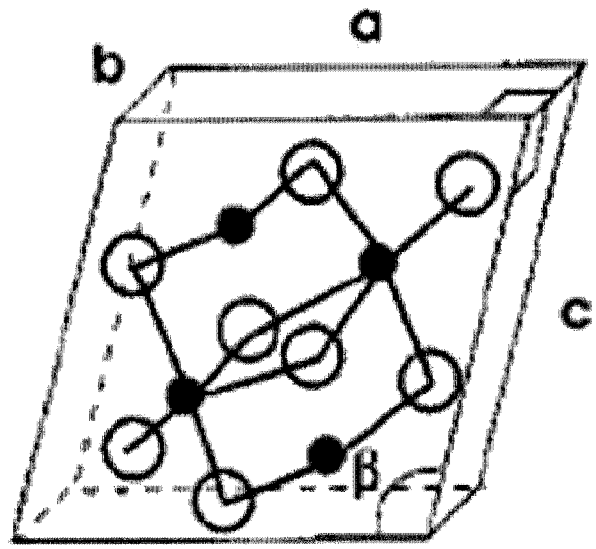
FIG. 3A and FIG. 3B are schematic views illustrating crystalline structures of hafnium oxide films.
Figure 3B:
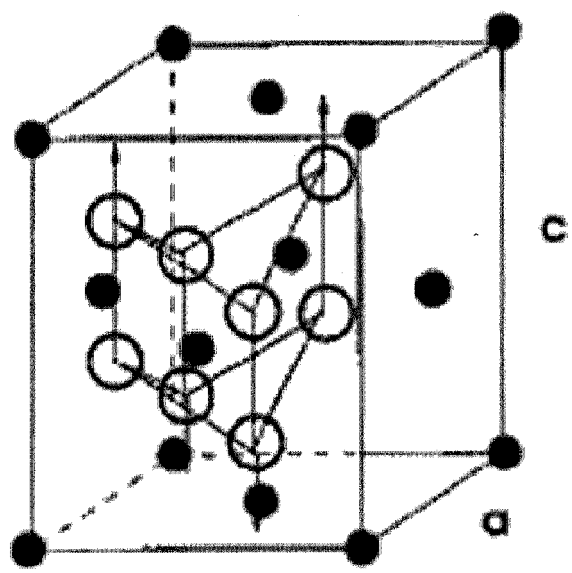
Figure 4:
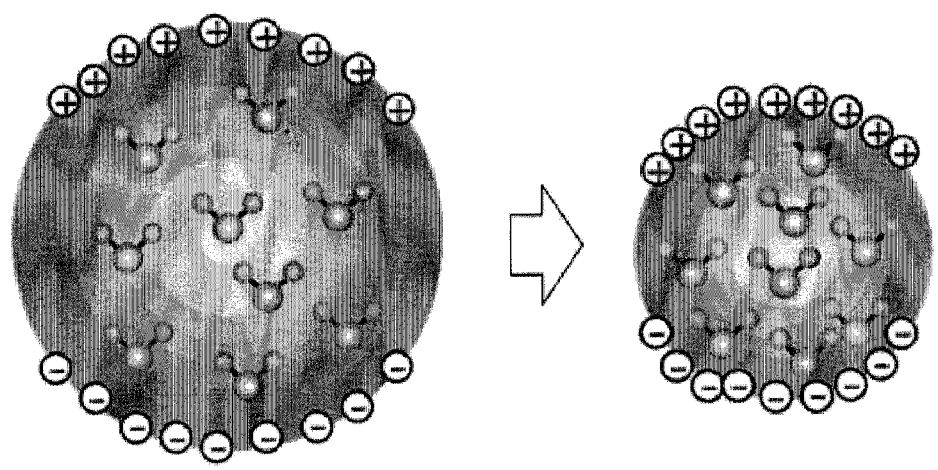
FIG. 4 is a schematic view illustrating a surface area variation of a hafnium oxide film according to phase transition.

When a film such as a hafnium oxide film or a zirconium oxide film is formed as an insulating film of a capacitor according to the related art, the crystalline structure of the film is usually monoclinic as shown in FIG. 3A, and the dielectric constant of the film is low. The relationship between crystalline structure and dielectric constant will now be explained with reference to a schematic view of FIG. 4. In the following description, a hafnium oxide film will be mainly explained. However, the explanation is not limited to the hafnium oxide film but may be equally applied to other high-k films such as a zirconium oxide film. A tetragonal crystalline structure shown in FIG. 3B has a smaller molecular volume but a higher polaron density as compared with a monoclinic crystalline structure. Thus, the charge density of the tetragonal crystalline structure is high due to a decreased surface area, and the dielectric constant of the tetragonal crystalline structure is high. In this way, the dielectric constant of a crystalline structure is varied according to the phase transition of a crystalline structure.

If an annealing process (heat treatment) is performed on a film after forming the film, the crystalline structure of the film can change from amorphous phase to tetragonal phase. It is necessary to perform an annealing process at 1670° C. to change a pure hafnium oxide film from amorphous phase to tetragonal phase. However, since a processing furnace in which a decompressing treatment is performed is generally resistant only up to 1000° C., it is necessary to perform an annealing process at a lower temperature.

If a first film containing a first element (for example, Hf) is added with a second element (for example, Al) different from the first element (by a doping or laminating method), the phase transition temperature of the first film may change according to the mixing ratio of the first film. For example, as compared with a pure first film, a mixed film formed by a doping method (or stacked films) may have a lower phase transition temperature. In addition, before an annealing process is performed on a mixed film, it is necessary to keep the mixed film in amorphous phase instead of monoclinic phase. The reason for this is that transition from monoclinic phase to tetragonal phase does not occur because the monoclinic phase is stable. Selective growth from amorphous phase to another phase is possible by adjusting the temperature of an annealing temperature.

Therefore, if an amorphous mixed film is formed by doping a first film containing a first element with a second element different from the first element and the amorphous mixed film is annealed to cause phase transition from amorphous phase to tetragonal phase, a film having a higher dielectric constant than a pure monoclinic film not containing the second element can be formed at a low temperature. In addition, a high-k film stable at a high temperature, such as a capacitor insulating film, can be formed by using the above-described film.

Figure 5:
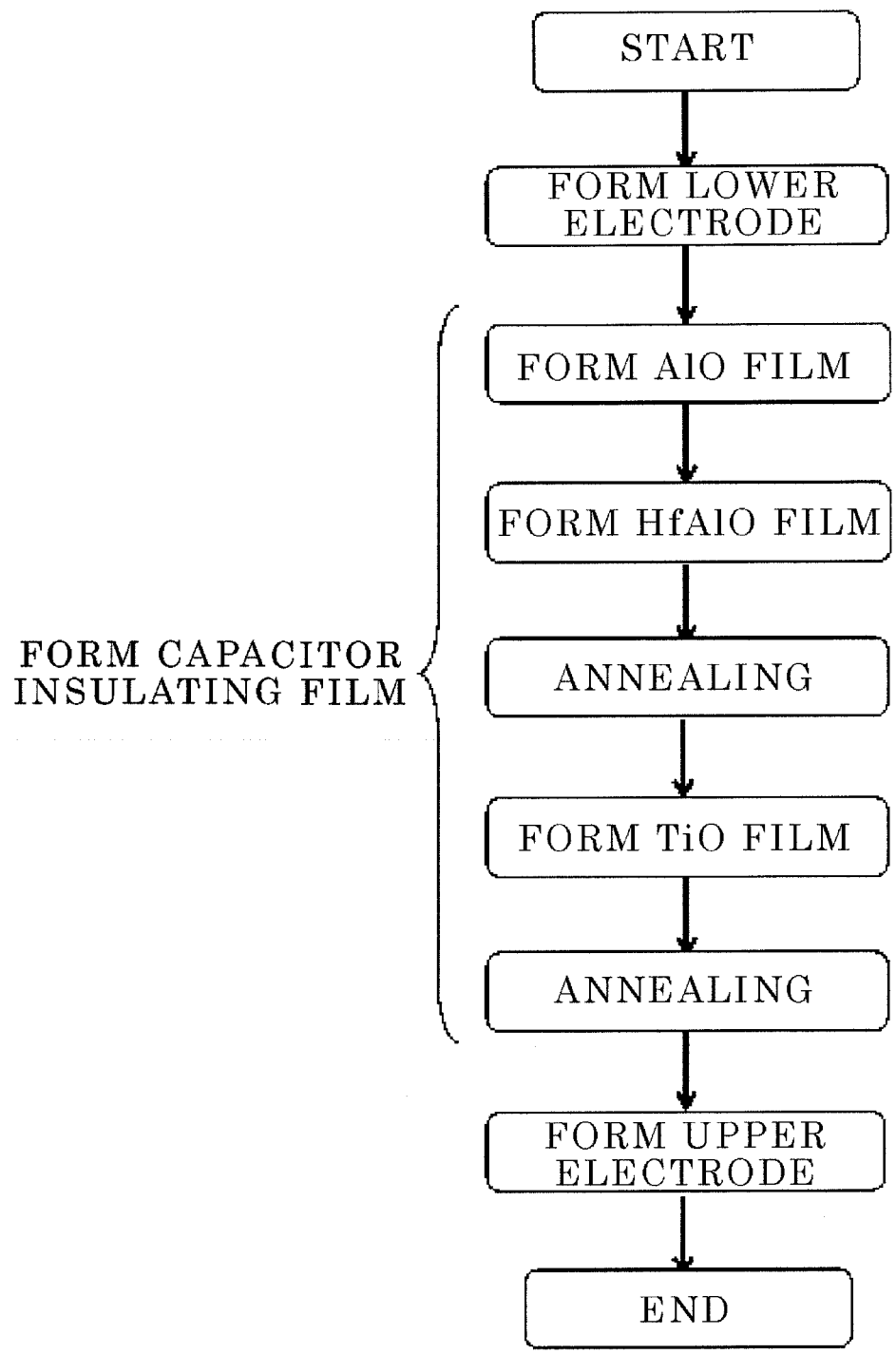
FIG. 5 is a schematic flowchart for explaining flows for forming a dynamic random access memory (DRAM) device according to the embodiment of the present invention.

FIG. 5 is a schematic flowchart for explaining flows of forming a dynamic random access memory (DRAM) device according to the embodiment of the present invention. In the current embodiment, a lower electrode is first formed on a substrate. Then, a capacitor insulating film may be formed through: a process of forming an aluminum oxide film on the lower electrode as a first film; a process of forming an amorphous hafnium aluminate film (hereinafter, referred to as an α-hafnium aluminate film) on the aluminum oxide film as a second film (a second insulating film formed by adding a second element to a first insulating film); a process of annealing (heat-treating) the substrate where the α-hafnium aluminate film is formed so as to form a third insulating film by changing the phase of the α-hafnium aluminate film; a process of forming a titanium oxide film on the annealed hafnium aluminate film as a fourth insulating film; and a process of annealing the substrate where the titanium oxide film is formed. Thereafter, an upper electrode is formed on the capacitor insulating film. In this way, a DRAM device can be formed.

As a source gas which is a film-forming material, Hf-containing gas such as tetrakis ethyl methyl amino hafnium (TEMAH, Hf(NEtMe)$_4$), Hf(O-tBu)$_4$, tetrakis dimethyl amino hafnium (TDMAH, Hf(NMe$_2$)$_4$), tetrakis diethyl amino hafnium (TDEAH, Hf(NEt$_2$)$_4$), Hf(MMP)$_4$, and Hafnium tetrachloride (HfCl$_4$) may be used; and Zr-containing gas such as Zr(NEtMe)$_4$, Zr(O-tBu)$_4$, Zr(NMe$_2$)$_4$, Zr(NEt$_2$)$_4$, a$_{nd}$ Zr(MMP)$_4$ may be used. In addition, Al-containing gas such as TMA may be used, and Ti-containing gas such as titanium tetrachloride (TiCl$_4$) may be used. In the above-mentioned chemical formulas, "Et" denotes C$_2$H$_5$, "Me" denotes CH$_3$, "O-tBu" denotes OC(CH$_3$)$_3$, and "MMP" denotes OC(CH$_3$)$_2$CH$_2$OCH$_3$. In addition, for example, H$_2$O or O$_3$ may be used as an oxidant.

Hereinafter, a detailed explanation will be given. In the following description, an explanation will be given on an exemplary method of forming a DRAM device by forming an aluminum oxide film, an α-hafnium aluminate film, and a titanium oxide film as a first insulating film, a second insulating film, and a fourth insulating film by using an atomic layer deposition (ALD) method.

In the ALD method which is a kind of chemical vapor deposition (CVD) method, reactive gases including at least two kinds of film-forming sources are alternately supplied to a substrate under predetermined film formation conditions (temperature, time, etc.) so that the reactive gases can be adsorbed on the substrate on an atomic layer basis to form a film by a surface reaction. At this time, the thickness of the film can be controlled by adjusting the number of reactive gas supply cycles (for example, if the film forming rate is 1 Å/cycle and it is intended to form a 20-Å film, the film-forming process may be performed 20 cycles).

(1) Lower Electrode Forming Process

Films such as titanium nitride (TiN) films are formed as lower electrodes on substrates such as wafers 200. This lower electrode forming process is performed in a processing furnace (not shown) different from the processing furnace 202 where capacitor insulating films (described later) will be formed.

(2) Aluminum Oxide Film Forming Process

Figure 15:
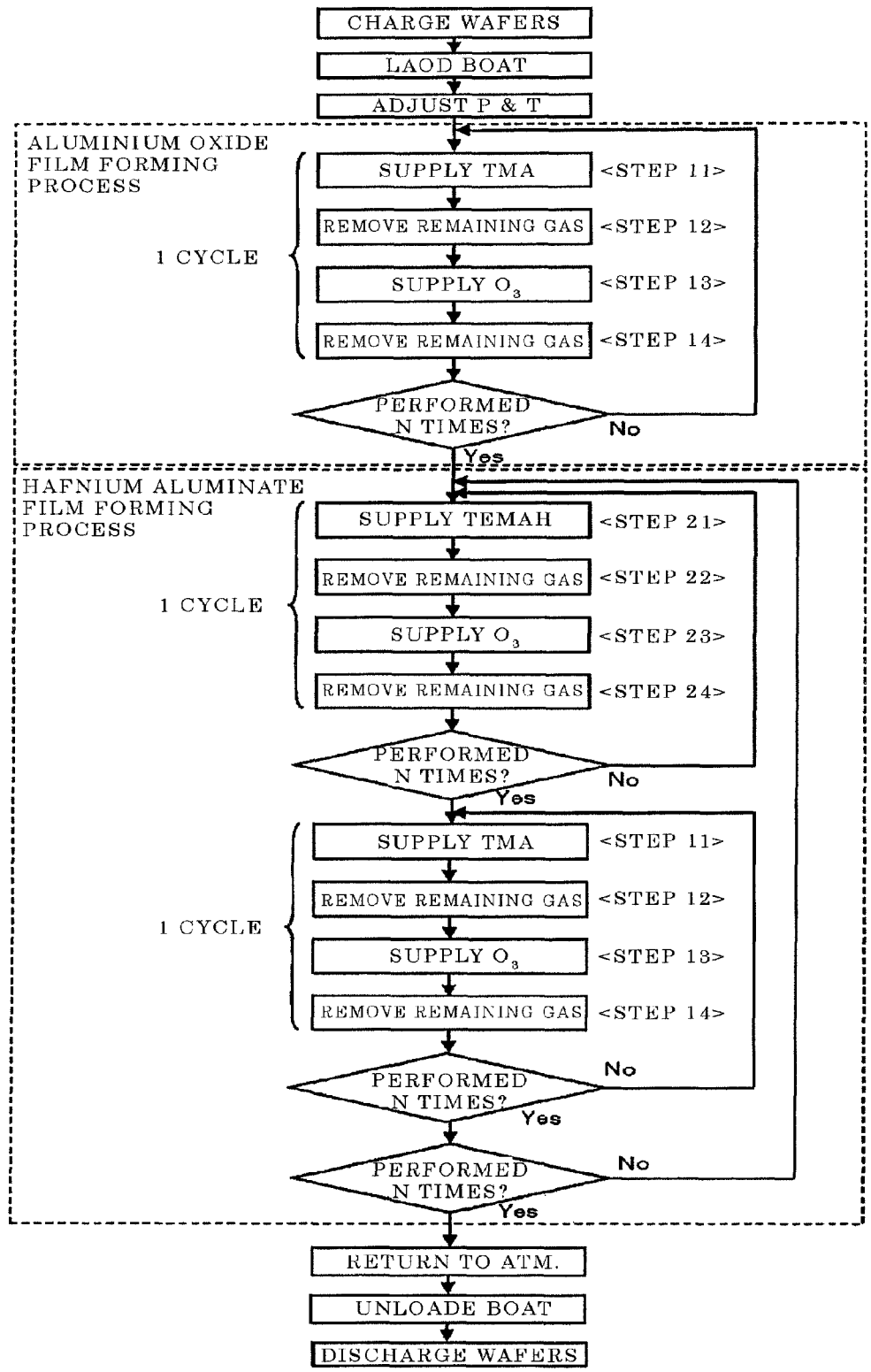
FIG. 15 is a flowchart for explaining processes of forming an aluminum oxide film and a hafnium aluminate oxide film according to the embodiment of the present invention.

FIG. 15 is a flowchart for explaining processes of forming an aluminum oxide film and a hafnium aluminate oxide film according to an embodiment of the present invention. In the "aluminum oxide film forming process" shown in FIG. 15, aluminum oxide (AlO) films are formed on the lower electrodes (TiN films). In the process, aluminum oxide film are formed on the lower electrodes (TiN films) to a predetermined thickness by performing, at least once, a cycle including a process of supplying an Al-containing gas into the processing chamber 201 as a second source gas; a process of removing the Al-containing gas remaining in the processing chamber 201; a process of supplying an O-containing gas into the processing chamber 201 as a reaction gas; and a process of removing the O-containing gas remaining in the processing chamber 201.

Figure 6:
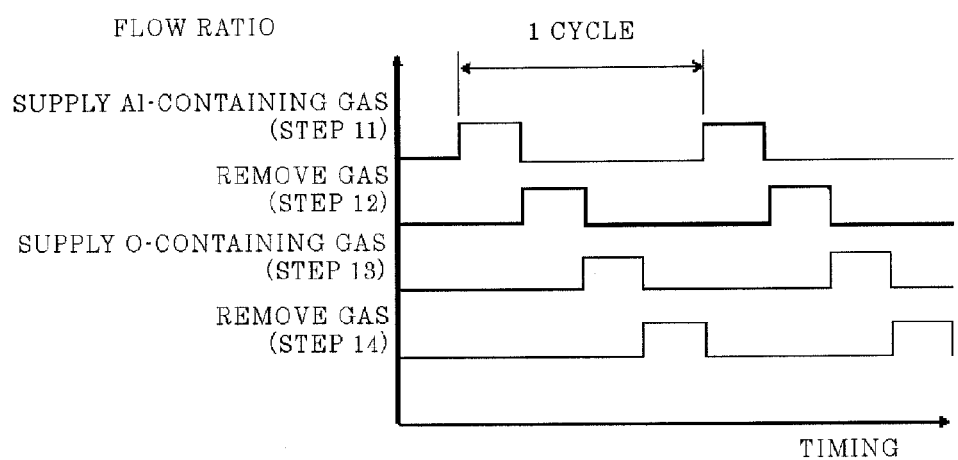
FIG. 6 is a view illustrating gas supply timing of an aluminum oxide film forming sequence according to the embodiment of the present invention.

FIG. 6 is a view illustrating gas supply timing of an aluminum oxide film forming sequence according to the embodiment of the present invention. The horizontal axis denotes gas supply timing, and the vertical axis denotes gas supply ratio. Furthermore, in the current embodiment, TMA gas is used as an Al-containing gas. In addition, $H_2O$ gas is preferable as an oxidant (O-containing gas); however, $O_3$ gas may be used instead of $H_2O$ gas. In this case, $O_3$ gas may be used at a concentration of 200 g/N·m$^3$ or lower so as to prevent oxidation of the lower electrodes (TiN films).

A plurality of wafers 200 where lower electrodes are formed are charged into the boat 217, and the boat 217 is loaded into the processing chamber 201. After the boat 217 is loaded into the processing chamber 201, the following fours steps (steps 11 to 14) are sequentially performed. The steps 11 to 14 are performed until aluminum oxide films are formed to a predetermined thickness (refer to FIG. 6).

(Step 11)

In step 11, TMA gas is supplied into the processing chamber 201 as a second source gas. TMA is liquid at normal temperature. Thus, TMA may be supplied into the processing chamber 201 after evaporating the TMA by heating the TMA, or inert gas such as helium (He) gas, neon (Ne) gas, argon (Ar) gas, or nitrogen ($N_2$) gas may be supplied to the TMA container 260 so as to evaporate TMA and supply the TMA into the processing chamber 201 together with the inert gas. In the following description, the latter case will be explained as an example.

First, the valve 252 installed in the gas supply pipe 232a (carrier gas supply pipe) at the upstream side of the TMA container 260 is opened, and a carrier gas such as He, Ne, Ar, or $N_2$ gas is supplied into the TMA container 260 while controlling the flow rate of the carrier gas with the mass flow controller 241a. TMA evaporates in the TMA container 260 as TMA gas. In addition, the valve 250 installed between the TMA container 260 and the processing chamber 201, and the APC valve 243d installed at the exhaust pipe 231 are opened together, so as to supply a mixture gas of the TMA gas and the carrier gas into the processing chamber 201 through the gas supply holes 233a of the confluent gas supply nozzle 233 and exhaust the mixture gas through the exhaust pipe 231.

When the TMA gas flows, the inside pressure of the processing chamber 201 is kept in the range from 30 Pa to 500 Pa, for example, at 60 Pa, by properly adjusting the APC valve 243d. The supply flowrate of the carrier gas controlled by the mass flow controller 241a is, for example, 1 slm or lower. The supply time of TMA gas into the processing chamber 201 may be set to, for example, 10 seconds. So as to cause the TMA gas to be further adsorbed after that, exposure time to a higher pressure atmosphere may be set to, for example, 0 to 10 seconds. At this time, the temperature of the wafers 200 is kept in the range from 150° C. to 250° C., for example, at 250° C.

At the same time, the valve 254 of the gas supply pipe 232e connected to the gas supply pipe 232b, and the valve 257 of the gas supply pipe 232f connected to the gas supply pipe 232c are opened so as to supply inert gas into the gas supply pipe 232b and the gas supply pipe 232c. By this, the TMA gas can be prevented from flowing into the gas supply pipe 232b and the gas supply pipe 232c.

At this time, gases flowing in the processing chamber 201 are TMA gas and inert gas such as $N_2$ or Ar gas but $O_3$ gas does not exist in the processing chamber 201. Therefore, TMA does not participate in a gas phase reaction but reacts with the surfaces of the TiN electrodes formed on the wafers 200 (chemical adsorption) to form source (TMA) adsorption layers or Al layer (hereinafter also referred to as Al-containing layers). The TMA adsorption layer includes a discontinuous adsorption layer of source molecules as well as a continuous adsorption layer of source molecules. The Al layer includes a continuous layer formed of Al, and Al thin films in which such continuous Al layers are superimposed on each other. In addition, a continuous layer formed of Al may also be called "an Al thin film."

(Step 12)

After forming the films, in step 12, the valve 250 is closed, and the APC valve 243d is kept open to evacuate the inside of the processing chamber 201 for removing TMA gas that remains in the processing chamber 201 after contributing to formation of the film. At this time, if the inside of the processing chamber 201 is purged by opening the valves 254 and 257 and supplying inert gas such as $N_2$ gas into the processing chamber 201 through the gas supply pipe 232b and the gas supply pipe 232c, gases such as TMA gas contributed to formation of the film may be removed from the inside of the processing chamber 201 more effectively.

(Step 13)

In step 13, $O_3$ gas is supplied into the processing chamber 201 as a reaction gas. The valve 243b installed at the gas supply pipe 232b, and the APC valve 243d installed at the exhaust pipe 231 are opened together, so as to adjust the flow rate of $O_3$ gas by using the mass flow controller 241b and supply the $O_3$ gas into the processing chamber 201 through the gas supply holes 233a of the confluent gas supply nozzle 233 while exhausting the $O_3$ gas through the exhaust pipe 231.

When the $O_3$ gas flows, the inside pressure of the processing chamber 201 is kept in the range from 30 Pa to 500 Pa, for example, at 130 Pa, by properly adjusting the APC valve 243d. The supply flowrate of the $O_3$ gas controlled by the mass flow controller 241b is, for example, 15 slm at a concentration of 250 g/m$^3$. The wafers 200 are exposed to the $O_3$ gas for 20 seconds, for example. At this time, the heater 207 is operated to keep the temperature of the wafers 200 in the range from 150° C. to 250° C., for example, at 250° C.

At the same time, the valve 253 of the gas supply pipe 232d connected to the gas supply pipe 232a, and the valve 257 of the gas supply pipe 232f connected to the gas supply pipe 232c are opened so as to supply inert gas into the gas supply pipe 232a and the gas supply pipe 232c. By this, the $O_3$ gas can be prevented from flowing into the gas supply pipe 232a and the gas supply pipe 232c.

By surface reaction (chemical adsorption) between the supplied $O_3$ gas and the Al-containing layers chemically adsorbed on the wafers 200, aluminum oxide films are formed on the wafers 200.

(Step 14)

After forming the film, in step 14, the valve 243b is closed, and the APC valve 243d is kept open to evacuate the inside of the processing chamber 201 to a pressure of, for example, 20 Pa or lower, so as to remove $O_3$ gas that remains in the processing chamber 201 after contributing to formation of the film. At this time, if the inside of the processing chamber 201 is purged by opening the valves 253 and 257 and supplying inert gas such as $N_2$ gas into the processing chamber 201 through the gas supply pipe 232a and the gas supply pipe 232c, gases such as $O_3$ gas contributed to formation of the film may be removed from the inside of the processing chamber 201 more effectively.

The steps 11 to 14 are set as one cycle, and the cycle is performed at least once to form aluminum oxide films on the wafers 200 to a predetermined thickness. Preferably, the aluminum oxide films are formed to a thickness of 0.5 Å to 5 Å.

In the above-described embodiment, before $O_3$ gas is supplied in step 13, TMA gas is removed from the processing chamber 201 in step 12. In addition, before TMA gas is supplied in step 11, $O_3$ gas is removed from the processing chamber 201 in step 14. Owning to this, TMA and $O_3$ may not react with each other on the way to the wafers 200. Thus, TMA and $O_3$ supplied into the processing chamber 201 contribute only to formation of films on the wafers 200, and thus reaction efficiency can be improved.

(3) α-Hafnium Aluminate Film Forming Process

In a hafnium aluminate film forming process of FIG. 15, second insulating films are formed according to the embodiment of the present invention. In the process, a cycle is performed one or more times, which includes: a first process of forming amorphous hafnium oxide films (hereinafter referred as α-hafnium films) as first insulating films including hafnium as a first element, and a second process of forming α-hafnium aluminate films as second insulating films by adding aluminum (second element) to the α-hafnium oxide films.

In the first process, a process (step 21) of supplying Hf-containing gas into the processing chamber 201 as a first source gas; a process (step 22) of removing the Hf-containing gas remaining in the processing chamber 201; a process (step 23) of supplying O-containing gas into the processing chamber 201 as a reaction gas; and a process (step 24) of removing the O-containing gas remaining in the processing chamber 201 are set as one cycle, and the cycle is performed one or more times. In this way, α-hafnium oxide films are formed on the wafers 200 to a predetermined thickness as first insulating films.

In the second process, the same process as the above-described aluminum oxide film forming process (step 11 to step 14) is performed after the first process. Each time after hafnium oxide films are formed to a predetermined thickness, aluminum oxide films are formed to a predetermined thickness according to a predetermined sequence, so that the aluminum oxide films can be mixed in the hafnium oxide films at a predetermined concentration. In this way, aluminum which is a second element can be added to the α-hafnium oxide films so as to form α-hafnium aluminate films on the wafers 200 as second insulating films.

A main condition for changing a high-k film such as a hafnium oxide film to amorphous phase is temperature. Therefore, in this process, hafnium oxide films are formed after setting the heating temperature of the wafers 200 to a temperature where a monoclinic crystal does not generate, so as to form the hafnium oxide films as α-hafnium oxide films. The concentration of the aluminum oxide films in the hafnium oxide films can be controlled to a desire level by adjusting the execution number of the aluminum oxide film forming cycle of the aluminum oxide film forming process (2) with respect to the execution number of the hafnium oxide film forming cycle. For example, if annealing is performed at about 600° C., preferably, the concentration of the aluminum oxide films may be kept in the range from 1% to 10%. If the concentration of the aluminum oxide films is kept at 8% or higher, the phase of the α-hafnium aluminate films may be changed to tetragonal phase almost a hundred percent in a "(4) tetragonal hafnium aluminate film forming process" (described later). In addition, if annealing is performed at about 700° C., it is preferable that the concentration of the aluminum oxide films is 16% or higher, for example.

In the following description, an explanation will be given on the case where TEMAH gas is used as a first source gas (Hf-containing gas). As a reaction gas (oxidant, O-containing gas), gas such as $H_2O$ gas or $O_3$ gas is used. Particularly, for a film thickness distant from the lower electrode by about 5 Å to 20 Å, $H_2O$ gas may be preferably used to prevent oxidation of the lower electrodes, or $O_3$ gas may be used at a low concentration of 200 g/N·m³ or lower at which the lower electrodes (TiN films) are not oxidized. In addition, for a film thickness from which oxidation of the lower electrode does not occur, $O_3$ gas may be preferably used at a high concentration of 200 g/N·m³ or higher to reduce impurities and improve film quality.

Figure 7:
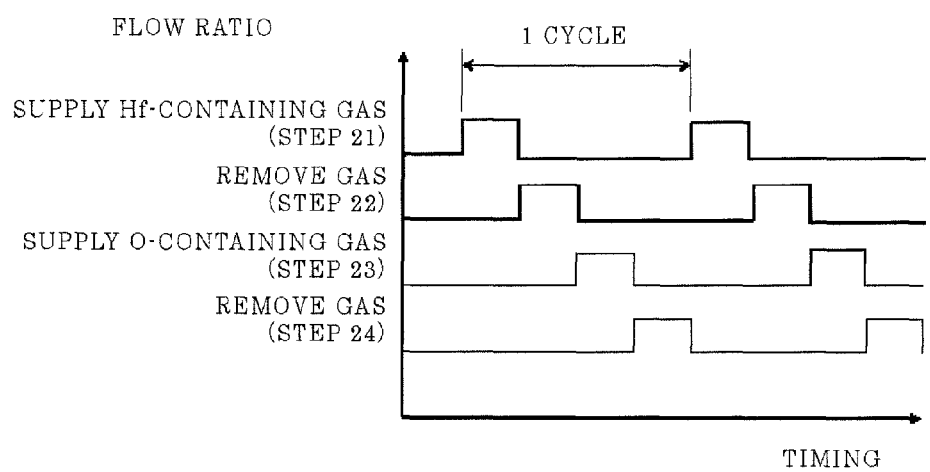
FIG. 7 is a view illustrating gas supply timing of a hafnium oxide film forming sequence according to the embodiment of the present invention.
Figure 8:
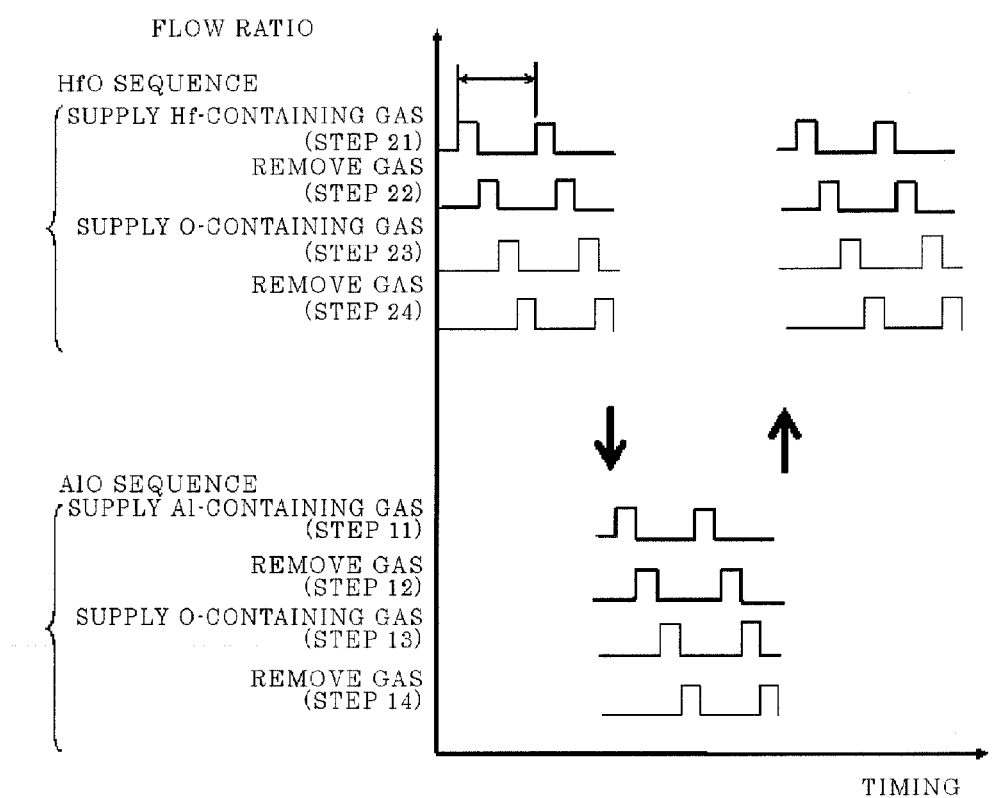
FIG. 8 is a view illustrating gas supply timing of a hafnium aluminate film forming sequence according to the embodiment of the present invention.

FIG. 7 is a view illustrating gas supply timing of a hafnium oxide film forming sequence (the first process) according to the embodiment of the present invention, and FIG. 8 is a view illustrating gas supply timing of a hafnium aluminate film forming sequence (the first process and the second process) according to the embodiment of the present invention. In FIG. 7 and FIG. 8, the horizontal axis denotes gas supply timing, and the vertical axis denotes gas supply ratio. First, an explanation will be given on the first process of forming a hafnium oxide film shown in FIG. 7 according to an α-hafnium aluminate film forming method shown in FIG. 8. In the first process, the following four steps (step 21 to step 24) are sequentially performed, and the step 21 to step 24 are performed one or more times until hafnium oxide films are formed to a predetermined thickness.

(Step 21)

In step 21, TEMAH gas is supplied into the processing chamber 201 as a first source gas. Since TEMAH is liquid at normal temperature like TMA, TEMAH may be supplied into the processing chamber 201 after evaporating the TEMAH by heating the TEMAH, or evaporated TEMAH may be supplied into the processing chamber 201 together with a carrier gas. In the following description, like the case of TMA, the latter case will be explained as an example.

First, the valve 255 installed in the gas supply pipe 232c (carrier gas supply pipe) at the upstream side of the TEMAH container 261 is opened, and a carrier gas such as He, Ne, Ar, or $N_2$ gas is supplied into the TEMAH container 261 while controlling the flow rate of the carrier gas by using the mass flow controller 241c. TEMAH evaporates in the TEMAH container 261 as TEMAH gas. In addition, the valve 256 installed between the TEMAH container 261 and the processing chamber 201, and the APC valve 243d installed at the exhaust pipe 231 are opened together, so as to supply a mixture gas of the TEMAH gas and the carrier gas into the processing chamber 201 through the gas supply holes 234a of the separative gas supply nozzle 234 and exhaust the mixture gas through the exhaust pipe 231.

When the TEMAH gas flows, the inside pressure of the processing chamber 201 is kept in the range from 30 Pa to 500 Pa, for example, at 100 Pa, by properly adjusting the APC valve 243d. The flowrate of the carrier gas controlled by the mass flow controller 241c is, for example, 5 slm. The supply time of TEMAH gas into the processing chamber 201 may be set to, for example, 1 second to 120 seconds. So as to cause the TEMAH gas to be further adsorbed after that, exposure time to a higher pressure atmosphere may be set to, for example, 0 to 4 seconds. At this time, the wafers 200 are kept in the temperature range from 150° C. to 250° C., for example, at 250° C. so that amorphous films can be formed instead of monoclinic films.

At the same time, the valve 253 of the gas supply pipe 232d connected to the gas supply pipe 232a, and the valve 254 of the gas supply pipe 232e connected to the gas supply pipe 232b are opened so as to supply inert gas into the gas supply pipe 232a and the gas supply pipe 232b. By this, the TEMAH gas can be prevented from flowing into the gas supply pipe 232a and the gas supply pipe 232b.

At this time, gases flowing in the processing chamber 201 are TEMAH gas and inert gas such as $N_2$ or Ar gas but $O_3$ gas does not exist in the processing chamber 201. Therefore, TEMAH does not participate in a gas phase reaction but reacts with the surfaces of the aluminum oxide films on the wafers 200 (chemical adsorption) to form source (TEMAH) adsorption layers or Hf layers (hereinafter also referred to as Hf-containing layers). The TEMAH adsorption layer includes a discontinuous adsorption layer of source molecules as well as a continuous adsorption layer of source molecules. The Hf layer includes a continuous layer formed of Hf, and Hf thin films in which such continuous Hf layers are superimposed on each other. In addition, a continuous layer formed of Hf may also be called "a Hf thin film."

(Step 22)

After forming the films, in step 22, the valve 256 is closed, and the APC valve 243d is kept open to evacuate the inside of the processing chamber 201 for removing TEMAH gas that remains in the processing chamber 201 after contributing to formation of the film. At this time, if the inside of the processing chamber 201 is purged by opening the valves 253 and 255 and supplying inert gas such as $N_2$ gas into the processing chamber 201 through the gas supply pipe 232a and the gas supply pipe 232b, gases such as TEMAH gas contributed to formation of the film may be removed from the inside of the processing chamber 201 more effectively.

(Step 23)

In step 23, $O_3$ gas is supplied into the processing chamber 201 as a reaction gas. The valve 243b installed at the gas supply pipe 232b, and the APC valve 243d installed at the exhaust pipe 231 are opened together, so as to adjust the flow rate of $O_3$ gas by using the mass flow controller 241b and supply the $O_3$ gas into the processing chamber 201 through the gas supply holes 233a of the confluent gas supply nozzle 233 while exhausting the $O_3$ gas through the exhaust pipe 231.

When the $O_3$ gas flows, the inside pressure of the processing chamber 201 is kept in the range from 30 Pa to 500 Pa, for example, at 130 Pa, by properly adjusting the APC valve 243d. The supply flowrate of the $O_3$ gas controlled by the mass flow controller 241b is, for example, 15 slm at a concentration of 250 g/m³. The wafers 200 are exposed to the $O_3$ gas for 20 seconds, for example. At this time, the temperature of the heater 207 is set in the temperature range from 150° C. to 250° C., for example, at 250° C. so that the wafers 200 can be kept in a temperature range where amorphous hafnium oxide films can be formed instead of monoclinic hafnium oxide films.

At the same time, the valve 253 of the gas supply pipe 232d connected to the gas supply pipe 232a, and the valve 257 of the gas supply pipe 232f connected to the gas supply pipe 232c are opened so as to supply inert gas into the gas supply pipe 232a and the gas supply pipe 232c. By this, the $O_3$ gas can be prevented from flowing into the gas supply pipe 232a and the gas supply pipe 232c.

By surface reaction (chemical adsorption) between the supplied $O_3$ gas and the Hf-containing layers chemically adsorbed on the wafers 200, α-hafnium oxide films can be formed on the wafers 200.

(Step 24)

After forming the film, in step 24, the valve 243b is closed, and the APC valve 243d is kept open to evacuate the inside of the processing chamber 201 to a pressure of, for example, 20 Pa or lower, so as to remove $O_3$ gas that remains in the processing chamber 201 after contributing to formation of the film. At this time, if the inside of the processing chamber 201 is purged by opening the valves 253 and 257 and supplying inert gas such as $N_2$ gas into the processing chamber 201 through the gas supply pipe 232a and the gas supply pipe 232c, gases such as $O_3$ gas contributed to formation of the film may be removed from the inside of the processing chamber 201 more effectively.

The step 21 to step 24 are set as one cycle, and the cycle is performed at least once to form α-hafnium oxide films on the wafers 200 to a predetermined thickness.

Each time after α-hafnium oxide films are formed to a predetermined thickness, aluminum oxide films are added to (doped in) the α-hafnium oxide films by performing an aluminum oxide film forming cycle (second process) according to the sequence of the aluminum oxide film forming process (2) so as to form α-hafnium aluminate films as second insulating films. Preferably, the concentration of the aluminum oxide films is adjusted so that about 1% to 10% of the aluminum oxide film is included in the α-hafnium oxide film. Preferably, each time the α-hafnium oxide film forming cycle (first process) is performed predetermined times, the aluminum oxide film forming cycle (second process) may be performed once or twice. The α-hafnium aluminate films are formed to a predetermined thickness, for example, 30 Å to 100 Å, according to a desired thickness of capacitor insulating films.

In addition, when α-hafnium aluminate films are formed by adding aluminum oxide films to α-hafnium oxide films, it is preferable that aluminum oxide films are formed at the last step in the film forming cycle. As described below, high-k tetragonal rutile type titanium oxide films are formed on the α-hafnium aluminate films. If aluminum oxide films are formed in the last step of the film forming cycle, Al having a smaller ion radius than Hf is abundantly added to the uppermost layers of the α-hafnium aluminate films, that is, to the under layers of titanium oxide films. Therefore, the crystal lattice size of the (tetragonal) under layers of the rutile type titanium oxide films can be adjusted similar to the crystal lattice size of the rutile type titanium oxide films, and thus the quality and other characteristics of the titanium oxide films can be improved.

(4) Tetragonal Hafnium Aluminate Film Forming Process

The α-hafnium aluminate films formed on the wafers 200 as described in the α-hafnium aluminate film forming process (3) are annealed (heat-treated) to form third insulating films by changing the phase of the α-hafnium aluminate films from amorphous to tetragonal phase. A process gas such as nitrogen ($N_2$) gas, argon (Ar) gas, hydrogen ($H_2$) gas, or oxygen ($O_2$) is supplied into the processing chamber 201. Although different gases are used according to processes, an exemplary process in which $N_2$ gas is used will be described in the current embodiment.

Furthermore, this process is performed in a processing furnace (not shown) different form the processing furnace 202. For example, a processing furnace using a lamp is used. At this time, the output of the lamp is set such that the temperature of the wafers 200 can be kept at a temperature where the α-hafnium aluminate films change from amorphous to tetragonal phase, for example, at a predetermined temperature in the range from 400° C. to 700° C., preferably, at 600° C.

The dielectric constant (k) of the tetragonal hafnium aluminate films is increased according to the concentration of Al included in the hafnium aluminate films, and is higher than the dielectric constant of the hafnium oxide films (k=15 to 40) and the dielectric constant of the aluminum oxide films (k=6 to 13). For example, the dielectric constant of the tetragonal hafnium aluminate films is 40 (k=40).

In addition, after phase transition, the crystalline structure of the hafnium aluminate films is not limited to the tetragonal phase. The crystalline structure of the hafnium aluminate films may be varied according to the crystalline structure of under layers. For example, if the under layers of the hafnium aluminate films are not the above-described aluminum oxide films but cubic titanium nitride (TiN) films, the phase of the hafnium aluminate films may be change to cubic phase. In this case, temperature dependence and Al concentration may also be considered.

(5) α-Titanium Oxide Film Forming Process

High-k rutile type a (amorphous)-titanium oxide films are formed on the hafnium aluminate films the phase of which was changed to tetragonal phase by annealing the wafers 200 in the tetragonal hafnium aluminate film forming process (4).

The titanium oxide films are formed in a processing furnace of a substrate processing apparatus different from the processing furnace 202 of the substrate processing apparatus 101 in which the hafnium aluminate films were formed. That is, after the tetragonal hafnium aluminate films are formed, the wafers 200 are unloaded from the substrate processing apparatus 101 and are loaded into another substrate processing apparatus to form titanium oxide films on the wafers 200 (descriptions of detailed procedures will be omitted).

Figure 9:
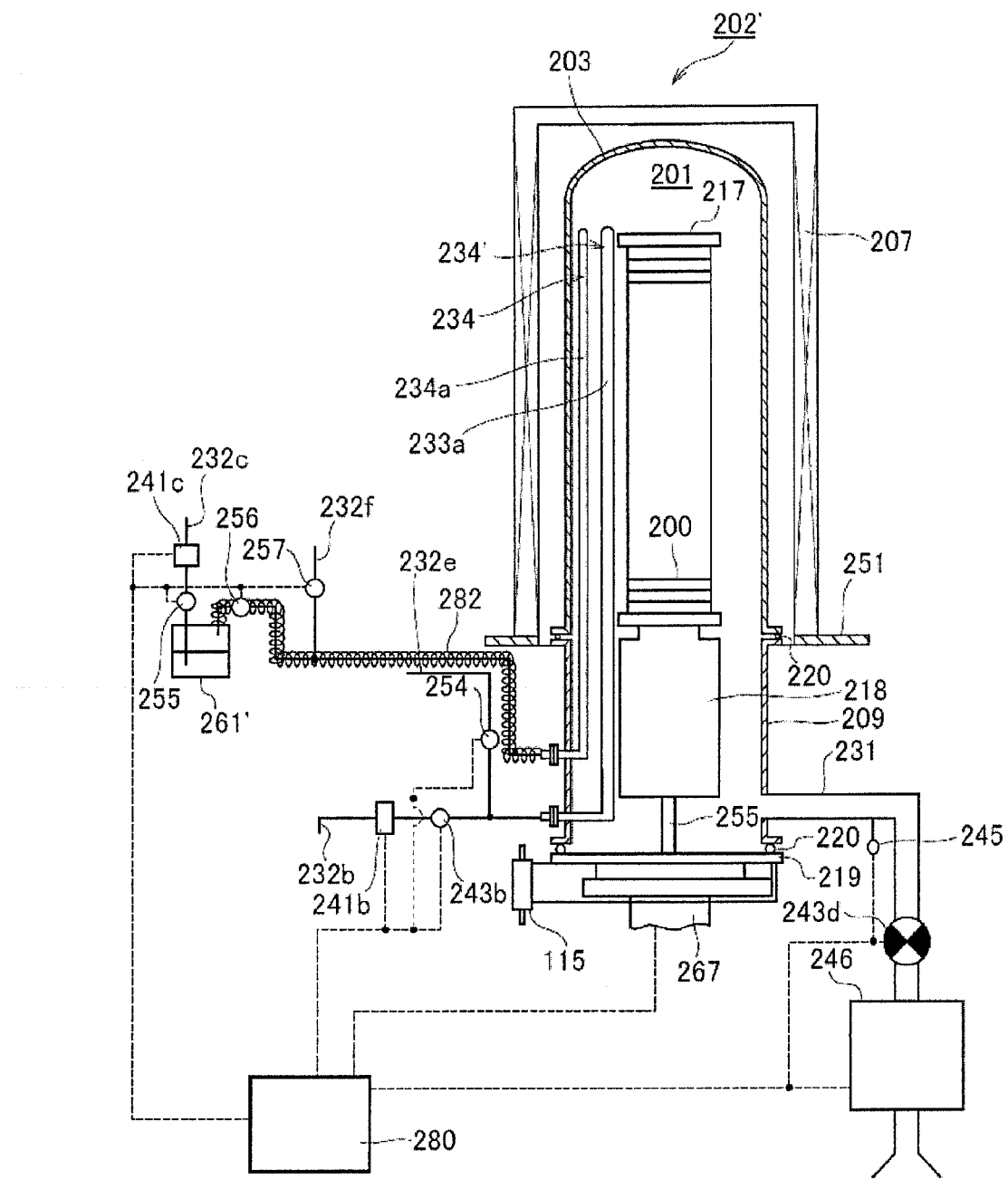
FIG. 9 is a schematic view illustrating an exemplary processing furnace and accompanying members that can be properly used according to the embodiment of the present invention, in which a vertical section of the processing furnace is illustrated.

FIG. 9 is a schematic view illustrating a processing furnace 202' (hereinafter referred to as TiO processing furnace 202') configured to form titanium oxide films. In the following features, the TiO processing furnace 202' is different from the processing furnace 202 (hereafter referred as a HfAlO processing furnace 202) configured to form hafnium aluminate films. That is, the HfAlO processing furnace 202 includes two gas supply nozzles: the confluent gas supply nozzle 233 and the separative gas supply nozzle 234. However, the TiO processing furnace 202' includes two separative gas supply nozzles 234 and 234' but does not include a confluent gas supply nozzle 233. In addition, the TiO processing furnace 202' does not include a gas supply pipe 232a configured to supply Al-containing gas. That is, Al-containing gas is not supplied through the gas supply nozzle 234' but O-containing gas and inert gas are supplied through the gas supply nozzle 234'. In addition, at a gas supply pipe 232c of the TiO processing furnace 202', a TEMAH container 261 is not installed but a $TiCl_4$ container 261' is installed to store titanium tetrachloride ($TiCl_4$) that is liquid at normal temperature. That is, Hf-containing gas is not supplied through the gas supply nozzle 234 but Ti-containing gas (third source gas) and inert gas are supplied through the gas supply nozzle 234. Other structures of the TiO processing furnace 202' are equal to those of the processing furnace 202 shown in FIG. 2.

Figure 10:
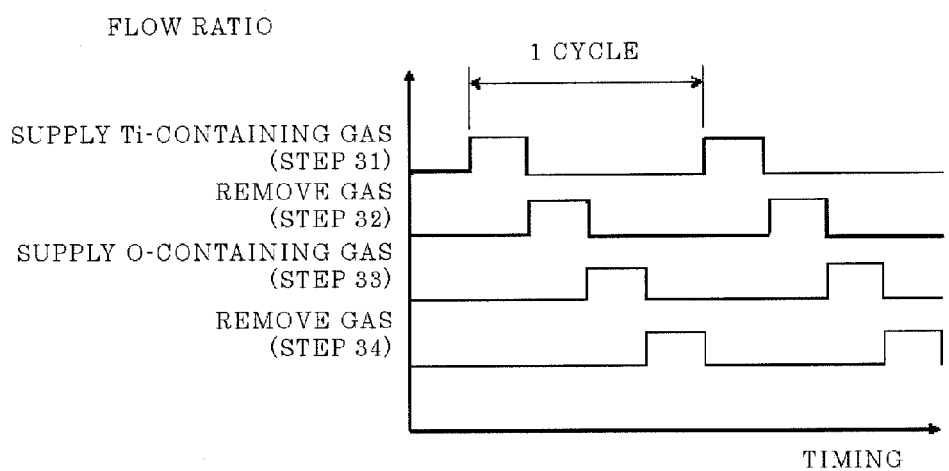
FIG. 10 is a view illustrating gas supply timing of a titanium oxide film forming sequence according to the embodiment of the present invention.

FIG. 10 is a view illustrating gas supply timing of a titanium oxide film forming sequence according to the current embodiment. The horizontal axis denotes gas supply timing, and the vertical axis denotes gas supply ratio. In the following description, an explanation will be given on an exemplary case of using titanium tetrachloride ($TiCl_4$) as a third source gas (Ti-containing gas). As an O-containing gas used as an oxidant, $H_2O$ or high-concentration $O_3$ is preferable. In this following description, an explanation will be given on the case of using $O_3$.

In the following titanium oxide film forming sequence, four steps (described later) are sequentially performed. That is, step 31 to step 34 are performed until titanium oxide films are formed to a predetermined thickness.

(Step 31)

In step 31, titanium tetrachloride gas is supplied into a processing chamber 201 as a third source gas. Since titanium tetrachloride is liquid at normal temperature like TMA and TEMAH, titanium tetrachloride may be supplied into the processing chamber 201 after evaporating the titanium tetrachloride by heating the titanium tetrachloride, or a carrier gas such as inert gas may be supplied to the $TiCl_4$ container 261' so as to evaporate titanium tetrachloride and supply the evaporated titanium tetrachloride into the processing chamber 201 together with the carrier gas. In the following description, the latter case will be explained like in the cases of TMA and TEMAH. Thus, a detailed description thereof will not be repeated.

First, a valve 255 installed in the gas supply pipe 232c (carrier gas supply pipe) at the upstream side of the $TiCl_4$ container 261' is opened, and a carrier gas such as He, Ne, Ar, or $N_2$ gas is supplied into the $TiCl_4$ container 261' while controlling the flow rate of the carrier gas with a mass flow controller 241c. Then, titanium tetrachloride evaporates in the $TiCl_4$ container 261' as titanium tetrachloride gas. In addition, a valve 256 installed between the $TiCl_4$ container 261' and the processing chamber 201, and an APC valve 243d installed at an exhaust pipe 231 are opened together, so as to supply a mixture gas of the titanium tetrachloride gas and the carrier gas into the processing chamber 201 through gas supply holes 234a of the separative gas supply nozzle 234 and exhaust the mixture gas through the exhaust pipe 231.

When the titanium tetrachloride gas flows, the inside pressure of the processing chamber 201 is kept in the range from 30 Pa to 500 Pa, for example, at 100 Pa, by properly adjusting the APC valve 243d. The flowrate of the carrier gas controlled by the mass flow controller 241c is, for example, 3 slm. The supply time of titanium tetrachloride gas into the processing chamber 201 may be set to, for example, 40 seconds. So as to cause the titanium tetrachloride gas to be further adsorbed after that, exposure time to a higher pressure atmosphere may be set to, for example, 0 to 4 seconds. At this time, the wafers 200 are kept in the temperature range from 150° C. to 500° C., for example, at 450° C. so that amorphous films can be formed instead of monoclinic films.

At the same time, a valve 257 of a gas supply pipe 232f connected to the gas supply pipe 232c is opened to supply inert gas into the gas supply pipe 232c. By this, the titanium tetrachloride gas can be prevented from flowing into the gas supply pipe 232c.

At this time, gases flowing in the processing chamber 201 are titanium tetrachloride gas and inert gas such as $N_2$ or Ar gas, but $O_3$ gas does not exist in the processing chamber 201. Therefore, titanium tetrachloride does not participate in a gas phase reaction but reacts with the surfaces of the tetragonal hafnium aluminate films on the wafers 200 (chemical adsorption) to form source (titanium tetrachloride) adsorption layers or Ti layers (hereinafter also referred to as Ti-containing layers). The titanium tetrachloride adsorption layer includes a discontinuous adsorption layer of source molecules as well as a continuous adsorption layer of source molecules. The Ti layer includes a continuous layer formed of Ti, and Ti thin films in which such continuous Ti layers are superimposed on each other. In addition, a continuous layer formed of Ti may also be called "a Ti thin film."

(Step 32)

After forming the films, in step 32, the valve 256 is closed, and the APC valve 243d is kept open to evacuate the inside of the processing chamber 201 for removing titanium tetrachloride gas that remains in the processing chamber 201 after contributing to formation of the film. At this time, if the inside of the processing chamber 201 is purged by opening valves 254 and 257 and supplying inert gas such as $N_2$ gas into the processing chamber 201 through the gas supply pipe 232b and the gas supply pipe 232c, gases such as titanium tetrachloride gas contributed to formation of the film may be removed from the inside of the processing chamber 201 more effectively.

(Step 33)

In step 33, $O_3$ gas is supplied into the processing chamber 201 as a reaction gas. The valve 243b installed at the gas supply pipe 232b, and the APC valve 243d installed at the exhaust pipe 231 are opened together, so as to adjust the flow rate of $O_3$ gas by using a mass flow controller 241b and supply the $O_3$ gas into the processing chamber 201 through gas supply holes 233a of the confluent gas supply nozzle 234' while exhausting the $O_3$ gas through the exhaust pipe 231.

When the $O_3$ gas flows, the inside pressure of the processing chamber 201 is kept in the range from 30 Pa to 500 Pa, for example, at 130 Pa, by properly adjusting the APC valve 243d. The supply flowrate of the $O_3$ gas controlled by the mass flow controller 241b is, for example, 15 slm at a concentration of 250 g/m$^3$. The wafers 200 are exposed to the $O_3$ gas for 60 seconds, for example. At this time, the temperature of the heater 207 is set in the temperature range from 150° C. to 500° C., for example, at 450° C. so that the wafers 200 can be kept in a temperature range where amorphous titanium oxide films can be formed instead of monoclinic titanium oxide films At the same time, the valve 254 of a gas supply pipe 232e connected to the gas supply pipe 232b is opened to supply inert gas into the gas supply pipe 232b. By this, the $O_3$ gas can be prevented from flowing into the gas supply pipe 232b.

By a surface reaction (chemical adsorption) between the supplied $O_3$ gas and the Ti-containing layers chemically adsorbed on the wafers 200, α-titanium oxide films are formed on the wafers 200.

(Step 34)

After forming the film, in step 34, the valve 243b is closed, and the APC valve 243d is kept open to evacuate the inside of the processing chamber 201 to a pressure of, for example, 20 Pa or lower, so as to remove $O_3$ gas that remains in the processing chamber 201 after contributing to formation of the film. At this time, if the inside of the processing chamber 201 is purged by opening the valves 254 and 257 and supplying inert gas such as $N_2$ gas into the processing chamber 201 through the gas supply pipe 232b and the gas supply pipe 232c, $O_3$ gas contributed to formation of the film may be removed from the inside of the processing chamber 201 more effectively.

The step 31 to step 34 are set as one cycle, and the cycle is performed at least once to form α-titanium oxide films on the wafers 200 to a predetermined thickness. For example, the α-titanium oxide films are formed to a thickness of 40 Å to 100 Å.

(6) Tetragonal Titanium Oxide Film Forming Process

The α-titanium oxide films formed on the wafers 200 as described in the α-titanium oxide film forming process (5) are annealed (heat-treated) to change the phase of the titanium oxide films from amorphous to tetragonal phase. A process gas such as nitrogen ($N_2$) gas, argon (Ar) gas, hydrogen ($H_2$) gas, and oxygen ($O_2$) is supplied into the processing chamber 201. In the current embodiment, the case of using $N_2$ gas is used will be described as an example.

Furthermore, this process is performed in a processing furnace (not shown) different form the processing furnaces 202 and 202'. For example, this process is performed in the processing furnace used to form the tetragonal hafnium aluminate films. That is, the processing furnace using a lamp may be used. At this time, the output of the lamp is set such that the temperature of the wafers 200 can be kept at a temperature where the α-titanium oxide films change from amorphous to tetragonal phase, for example, at a predetermined temperature in the range from 400° C. to 700° C., preferably, at 600° C.

Tetragonal (rutile type) titanium oxide films having a dielectric constant higher than the dielectric constant (about 80) of an orthorhombic (brookite type) titanium oxide film may be formed. For example, tetragonal titanium oxide films having a dielectric constant of 100 may be formed.

Through the above-described processes (2) to (6), oxidation and mixing of electrode interfaces can be prevented, and a capacitor insulating film can be formed by using both the technique of forming a tetragonal hafnium oxide film at a low temperature and the technique of forming a rutile type titanium oxide film at a low temperature.

(7) Upper Electrode Forming Process

As upper electrodes, for example, titanium nitride (TiN) films are formed on the capacitor insulating films. For example, the upper electrode forming process may be performed in the processing furnace (not shown) used to from the lower electrodes.

Figure 11:
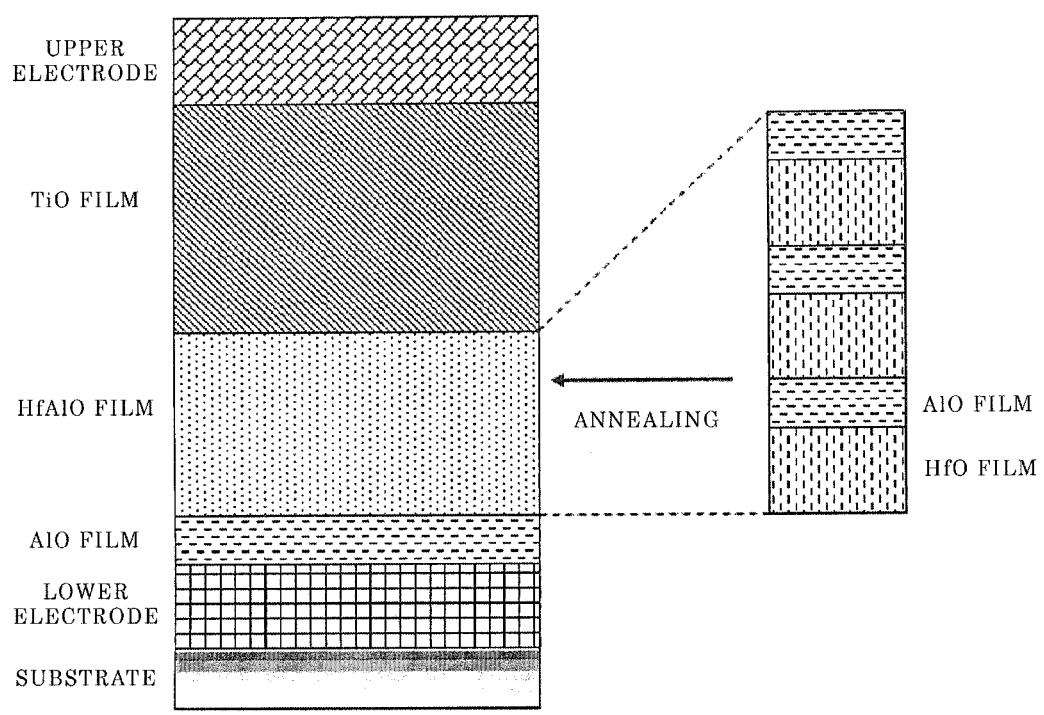
FIG. 11 is a schematic view illustrating a structure of a DRAM device according to a first embodiment of the present invention.

By performing the processes (1) to (7), a DRAM device is formed as shown in FIG. 11 according to the current embodiment.

As described above, a high-k capacitor insulating film which is stable at a high temperature can be formed by forming a lower electrode on a wafer 200, an aluminum oxide film on the lower electrode, a tetragonal hafnium aluminate film, and a tetragonal titanium oxide film. By this, a highly integrated 50 or less nanometer DRAM device can be formed.

Second Embodiment of the Present Invention

Next, a second embodiment of the present invention will be described. In the current embodiment, the same substrate processing apparatus as that used in the first embodiment may be used, and thus descriptions of the same features will not be repeated.

Figure 12:
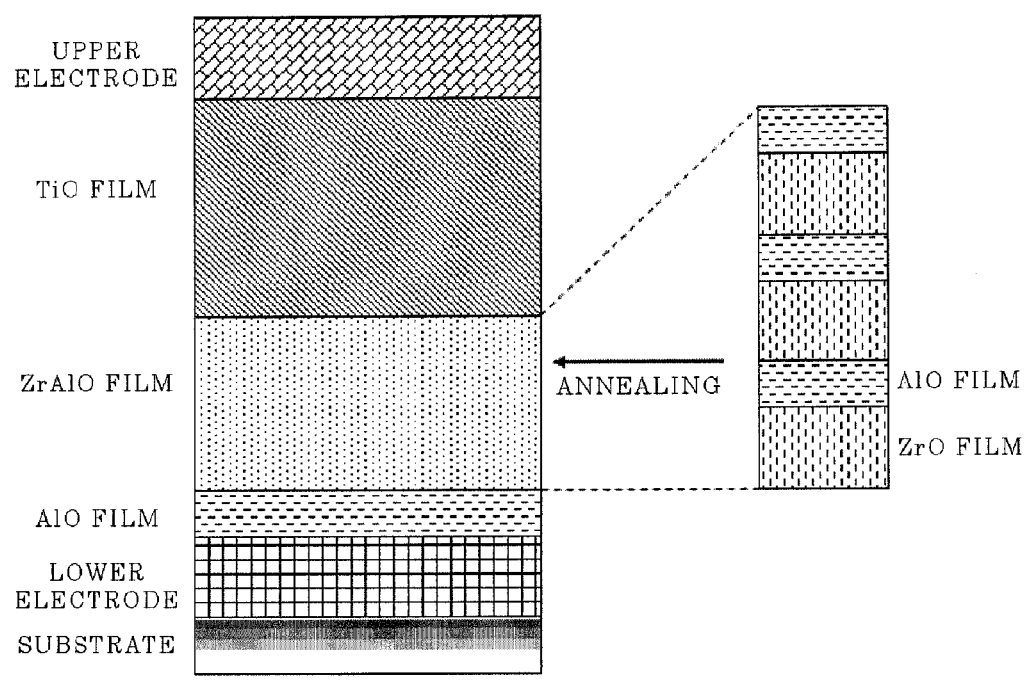
FIG. 12 is a schematic view illustrating a structure of a DRAM device according to a second embodiment of the present invention.

However, the current embodiment is different from the first embodiment in that a Zr-containing gas is used instead of a Hf-containing gas. That is, in the current embodiment, a tetrakis ethyl methyl amino zirconium (TEMAZ) container (not shown) is installed at the gas supply pipe 232c instead of the TEMAH container 261. The dielectric constant of a pure (monoclinic) zirconium oxide film is 25 (k=25) which is usually higher than the dielectric constant of a monoclinic hafnium oxide film. Therefore, by using a Zr-containing gas instead of a Hf-containing gas, a film having a higher dielectric constant can be obtained (refer to FIG. 12). For example, by using TEMAZ gas as a Zr-containing gas and $O_3$ gas as an oxidant (another O-containing gas such as $H_2O$ gas may be used as an oxidant), a dielectric constant of about 40 may be obtained.

Third Embodiment of the Present Invention

Next, a third embodiment will be explained as another embodiment of the present invention. In the current embodiment, the same substrate processing apparatus as that used in the first embodiment may be used, and thus descriptions of the same features will not be repeated.

Figure 13:
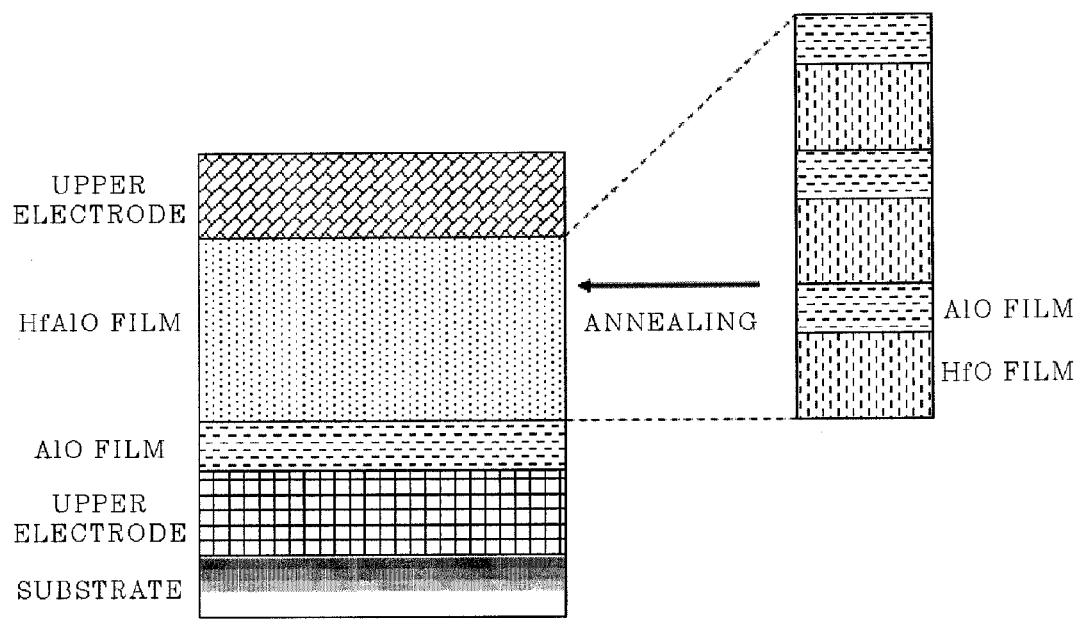
FIG. 13 is a schematic view illustrating a structure of a DRAM device according to a third embodiment of the present invention.

In the current embodiment, a TiO film is not formed on a hafnium aluminate film. That is, an aluminum oxide film and a tetragonal hafnium aluminate film that are formed on a lower electrode through the processes (1) to (4) of the first embodiment are used as a capacitor insulating film, and an upper electrode is formed on the capacitor insulating film through the process (7) of the first embodiment (refer to FIG. 13). At this time, the hafnium aluminate film is formed to a thickness of 100 Å. In this way, a capacitor can be formed without forming a titanium oxide film according to necessary characteristics. For example, the necessary characteristics may be a target dielectric constant and leak characteristics.

Fourth Embodiment of the Present Invention

Next, a fourth embodiment will be explained as another embodiment of the present invention. In the current embodiment, the same substrate processing apparatus as that used in the first embodiment may be used, and thus descriptions of the same features will not be repeated.

Figure 14:
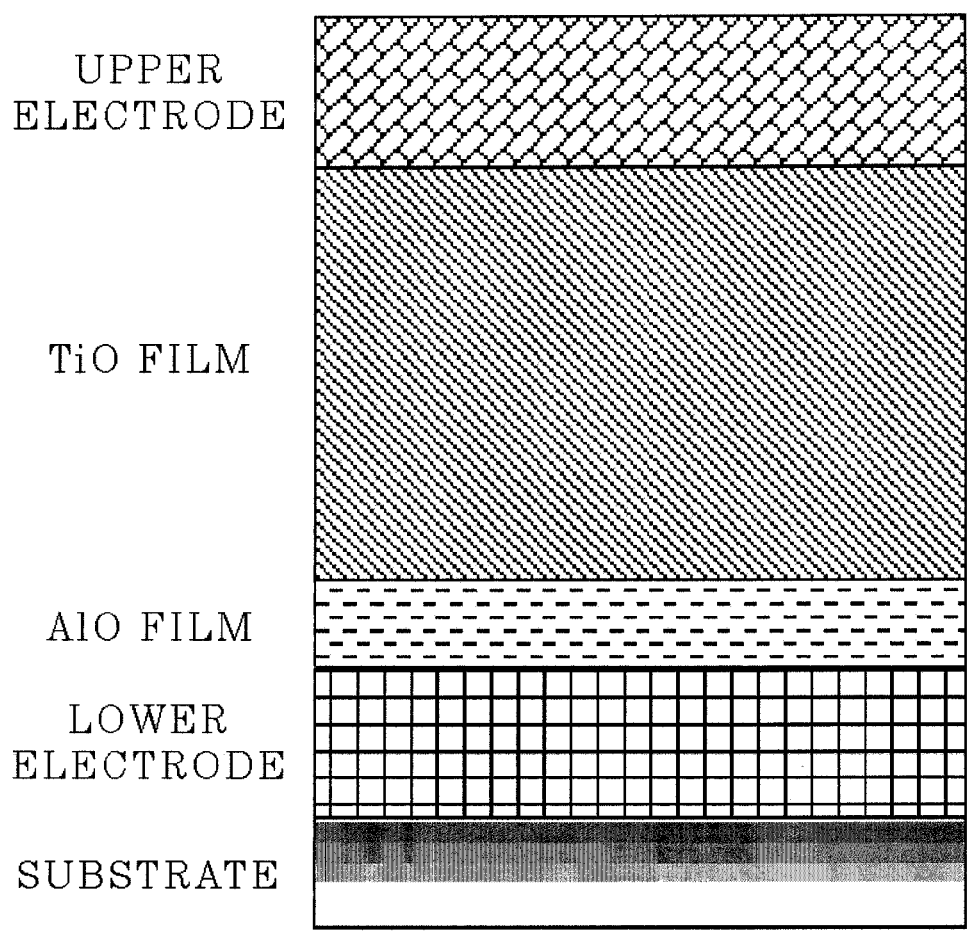
FIG. 14 is a schematic view illustrating a structure of a DRAM device according to a fourth embodiment of the present invention.

In the current embodiment, a TiO film is formed on an aluminum oxide film without forming a hafnium aluminate film on the aluminum oxide film. That is, an aluminum oxide film and a tetragonal titanium oxide film that are formed on a lower electrode through the processes (1), (2), (5), and (6) of the first embodiment are used as a capacitor insulating film, and an upper electrode is formed on the capacitor insulating film through the process (7) of the first embodiment (refer to FIG. 14). At this time, the tetragonal titanium oxide film is formed to a thickness of 100 Å. In this way, a capacitor can be formed without forming a hafnium aluminate film according to necessary characteristics. For example, the necessary characteristics may be a target dielectric constant and leak characteristics.

Fifth Embodiment of the Present Invention

Next, a fifth embodiment will be explained as another embodiment of the present invention. A processing furnace of the current embodiment has the same structure as that of the HfAlO processing furnace 202 of the first embodiment. In addition, like the TiO processing furnace 202', the processing furnace of the current embodiment includes a titanium tetrachloride gas supply nozzle (corresponding to the separative gas supply nozzle 234 of the processing furnace 202'), and a gas supply system (corresponding to parts of the processing furnace 202' such as the gas supply pipe 232c, the $TiCl_4$ container 261', and the valves 255 and 256) configured to supply titanium tetrachloride gas into a processing chamber 201 through the titanium tetrachloride gas supply nozzle.

In the current embodiment, a hafnium aluminate film and a titanium oxide film are formed successively in the same processing furnace. That is, the processes (2), (3), and (5) of the first embodiment are performed in the same processing furnace. By this, the substrate processing productivity can be improved. In addition, if a process (the above-described process (4)) for changing the phase of hafnium aluminate films to tetragonal phase, and a process (the above-described process (6)) for changing the phase of titanium oxide films to tetragonal phase are performed together, the processes (2), (3), and (5) of the first embodiment can be continuously performed, and thus the substrate processing productivity can be further improved.

According to the present invention, deterioration in throughput or cost of ownership (CoO: manufacturing costs per substrate) can be prevented when an insulating film is formed.

[Supplementary Note]

The present invention also includes the following embodiments.

According to an embodiment of the present invention, there is provided a method of manufacturing a semiconductor device, comprising:

forming a first amorphous insulating film comprising a first element on a substrate;

adding a second element different from the first element to the first insulating film so as to form a second amorphous insulating film on the substrate; and annealing the second insulating film at a predetermined annealing temperature so as to form a third insulating film by changing a phase of the second insulating film, wherein a concentration of the second element added to the first insulating film is controlled according to the annealing temperature.

Preferably, the second insulating film may be formed by alternately stacking:

a film comprising the first element and a third element different from the first element and the second element; and a film comprising the second element and the third element.

Preferably, the second insulating film may be formed by mixing the first element, the second element, and a third element different from the first element and the second element.

Preferably, the first element may be hafnium or zirconium, the second element may be aluminum,
the third insulating film may be a tetragonal hafnium aluminate film or a tetragonal zirconium aluminate film, and
if the annealing temperature is 600° C., a concentration of aluminum added to the first insulating film may be controlled so that the third insulating film may have an aluminum concentration of 1% to 10%.

Preferably, the first element may be hafnium or zirconium, the second element may be aluminum,
the third insulating film may be a tetragonal hafnium aluminate film or a tetragonal zirconium aluminate film, and
if the annealing temperature is 700° C., a concentration of aluminum added to the first insulating film may be controlled so that the third insulating film may have an aluminum concentration of 16% or higher.

According to another embodiment of the present invention, there is provided a method of manufacturing a semiconductor device by forming a rutile type titanium oxide film as a capacitor insulating film on a lower electrode formed on a substrate, the method comprising forming an insulating film having substantially the same crystal lattice size as that of the titanium oxide film as an under layer of the titanium oxide film.

Preferably, the lower electrode may be a titanium nitride film, and a cubic hafnium aluminate film or a cubic zirconium aluminate film may be formed as the under layer of the titanium oxide film.

According to another embodiment of the present invention, there is provided a semiconductor device comprising:

a titanium nitride film formed on a substrate as a lower electrode;

a cubic hafnium aluminate film or a cubic zirconium aluminate film formed directly on the titanium nitride film; and a titanium oxide film formed directly on the cubic hafnium aluminate film or the cubic zirconium aluminate film.

According to another embodiment of the present invention, there is provided a substrate processing apparatus comprising:

a processing chamber configured to accommodate a substrate;

a heating system configured to heat the substrate;

a first source gas supply system configured to supply a first source gas comprising a first element into the processing chamber;

a second source gas supply system configured to supply a second source gas comprising a second element different from the first element;

a reaction gas supply system configured to supply a reaction gas comprising a third element reacting with the first element and the second element into the processing chamber; and a control unit configured to control the heating system, the first source gas supply system, the second source gas supply system, and the reaction gas supply system, wherein the control unit controls the heating system, the first source gas supply system, the second source gas supply system, and the reaction gas supply system so as to alternately supply the first source gas and the reaction gas into the processing chamber for forming a first amorphous insulating film, alternately supply the second source gas and the reaction gas into the processing chamber for forming a second amorphous insulating film, form amorphous stacked films by alternately stacking the first insulating film and the second insulating film, and heat the stacked films to a predetermined temperature according to a concentration of the second insulating film in the stacked films for causing a phase transition of the stacked films to a cubic phase.

According to another embodiment of the present invention, there is provided a method of manufacturing a semiconductor device, the method comprising:

forming a first insulating film on a substrate;

forming a second amorphous insulating film on the first insulating film;

changing a phase of the second insulating film to a tetragonal phase;

forming an amorphous third insulating film on the second insulating film changed to the tetragonal phase; and changing a phase of the third insulating film to a tetragonal phase.

Preferably, the first insulating film may comprise a first source and an oxidant, the second insulating film may comprise the first source, a second source, and the oxidant, the third insulating film may comprise a third source and the oxidant.

Preferably, the first source may comprise aluminum, the second source may comprise hafnium zirconium, and the third source may comprise titanium.

Preferably, the first insulating film may be an aluminum oxide film, the second insulating film may be a hafnium oxide film, the stacked films may be a hafnium aluminate film, and the third insulating film may be a titanium oxide film.

Preferably, in the forming of the first insulating film, at least two kinds of sources are alternately supplied into a processing chamber to deposit the first insulating film, in the forming of the second amorphous insulating film, at least three kinds of sources are alternately supplied into the processing chamber to deposit the second insulating film, and in the forming of the amorphous third insulating film, at least two kinds of sources are supplied into the processing chamber to form the third insulating film.

Preferably, the substrate is heat-treated in the changing of the phase of the second insulating film and the changing of the phase of the third insulating film.

Preferably, the first insulating film may have a dielectric constant greater than that of the second insulating film.

Preferably, in the forming of the first insulating film, the forming of the second amorphous insulating film, and the forming of the second amorphous insulating film, the substrate is kept at a predetermined temperature between 150° C. and 250° C.

Preferably, in the changing of the phase of the second insulating film and the changing of the phase of the third insulating film, the substrate is heated in a range from 400° C. to 700° C.

According to another embodiment of the present invention, there is provided a method of manufacturing a semiconductor device, the method comprising:

forming a first insulating film on a substrate;

forming stacked films on the substrate by stacking the first insulating film and a second insulating film;

heating the stacked films to change a phase of the stacked films to a cubic phase;

forming a third insulating film on the stacked films changed to the cubic phase; and heating the third insulating film to change a phase of the third insulating film to a cubic phase.

Preferably, the forming of the first insulating film may comprise:

supplying a first source into a processing chamber;

exhausting the first source from the processing chamber;

supplying a first oxidant into the processing chamber; and exhausting the first oxidant from the processing chamber, wherein the first insulating film may be formed by performing, predetermined times, the supplying of the first source, the exhausting of the first source, the supplying of the first oxidant, and the supplying of the first oxidant, the forming of the stacked films may comprise:

supplying a second source into the processing chamber;

exhausting the second source from the processing chamber;

supplying a second oxidant into the processing chamber; and exhausting the second oxidant from the processing chamber, wherein the stacked films may be formed by alternately performing a second insulating film forming process predetermined times and the forming of the first insulating film predetermined times, wherein the second insulating film forming process may be performed by performing, predetermined times, the supplying of the second source, the exhausting of the second source, the supplying of the second oxidant, and the exhausting of the second oxidant, the forming of the third insulating film may comprise:
supplying a third source into the processing chamber;
exhausting the third source from the processing chamber;
supplying a third oxidant into the processing chamber; and
exhausting the third oxidant from the processing chamber,
wherein the third insulating film may be formed by performing, predetermined times, the supplying of the third source, the exhausting of the third source, the supplying of the third oxidant, and the exhausting of the third oxidant.

Preferably, the concentration of the first insulating film in the stacked films of the first and second insulating films may be 1% to 10%.

Preferably, before the forming of the first insulating film, a lower electrode may be formed on the substrate, and after the forming of the third insulating film, an upper electrode may be formed on the third insulating film.

Preferably, the first source may comprise aluminum,
the second source may comprise hafnium or zirconium, and
the third source may comprise titanium.

Preferably, the first insulating film may be an aluminum oxide film,
the second insulating film may be a hafnium oxide film,
the stacked films may be a hafnium aluminate film, and
the third insulating film may be a titanium oxide film.

According to another embodiment of the present invention, there is provided a method of forming an insulating film, the method comprising:

while heating a substrate to a predetermined temperature between 150° C. and 250° C., forming stacked films by alternately stacking one of a hafnium oxide film and a zirconium oxide film, and an aluminum oxide film on the substrate in a manner such that a concentration of the aluminum oxide film in the stacked films is in a range from 1% to 10%; and heating the substrate to a predetermined temperature equal to or higher than 400° C. so as to form a tetragonal hafnium aluminate film or a tetragonal zirconium aluminate film on the substrate by changing a phase of the stacked films to a tetragonal phase.

Preferably, a titanium oxide film may be formed on the tetragonal hafnium aluminate film or the tetragonal zirconium aluminate film.

According to another embodiment of the present invention, there is provided a semiconductor device comprising:
a lower electrode formed on a substrate;
a first insulating film formed on the lower electrode;
stacked films formed on the first insulating film by stacking first and second insulating films and heating the first and second insulating films to change a phase of the first and second insulating films to a cubic phase;
a third insulating film formed on the stacked films changed to the cubic phase, a phase of the third insulating film being changed to a cubic phase by heating; and
an upper electrode formed on the third insulating film.

Although a vertical batch type apparatus has been described, the present invention is not limited thereto. For example, the present invention can be applied to a single-wafer type apparatus and a horizontal type apparatus. In addition, although explanations have been given on exemplary cases of using an ALD method to form films, the present invention is not limited thereto. That is, other methods may be used to form films.

What is claimed is:

1. A method of manufacturing a semiconductor device, comprising:
   forming a first amorphous insulating film comprising one of hafnium and zirconium on a substrate;
   adding aluminum to the first amorphous insulating film so as to form a second amorphous insulating film on the substrate; and
   annealing the second amorphous insulating film at a predetermined annealing temperature so as to form a third insulating film including one of a tetragonal hafnium aluminate film and a tetragonal zirconium aluminate film by changing a phase of the second amorphous insulating film,
   wherein a concentration of the aluminum added to the first amorphous insulating film is controlled according to the annealing temperature such that the third insulating film has an aluminum concentration of 1% to 10% when the annealing temperature is 600° C.

2. A method of manufacturing a semiconductor device, comprising:
   forming a first amorphous insulating film comprising one of hafnium and zirconium on a substrate;
   adding aluminum to the first amorphous insulating film so as to form a second amorphous insulating film on the substrate; and
   annealing the second amorphous insulating film at a predetermined annealing temperature so as to form a third insulating film including one of a tetragonal hafnium aluminate film and a tetragonal zirconium aluminate film by changing a phase of the second amorphous insulating film,
   wherein a concentration of the aluminum added to the first amorphous insulating film is controlled according to the annealing temperature such that the third insulating film has an aluminum concentration of 16% or higher when the annealing temperature is 700° C.

* * * * *